United States Patent
Schroeder et al.

(10) Patent No.: US 8,688,390 B2
(45) Date of Patent: Apr. 1, 2014

(54) THERMOELECTRIC EVALUATION AND MANUFACTURING METHODS

(75) Inventors: Jon Murray Schroeder, Leander, TX (US); Gerald Phillip Hirsch, Clarksville, TN (US)

(73) Assignee: Jon Murray Schroeder, Cedar Park, TX (US)

( * ) Notice: Subject to any disclaimer, the term of this patent is extended or adjusted under 35 U.S.C. 154(b) by 1080 days.

(21) Appl. No.: 12/454,377

(22) Filed: May 18, 2009

(65) Prior Publication Data

US 2010/0288323 A1  Nov. 18, 2010

(51) Int. Cl.
*G01N 27/18* (2006.01)
*H01L 35/00* (2006.01)

(52) U.S. Cl.
USPC ............................................. 702/30; 136/201

(58) Field of Classification Search
USPC ................. 702/30; 324/451; 375/21; 136/201
See application file for complete search history.

(56) References Cited

U.S. PATENT DOCUMENTS

| | | | | |
|---|---|---|---|---|
| 4,542,345 A | * | 9/1985 | Tomasulo | 324/451 |
| 6,467,951 B1 | * | 10/2002 | Ghoshal | 374/45 |
| 6,487,515 B1 | * | 11/2002 | Ghoshal | 702/136 |
| 2005/0035773 A1 | * | 2/2005 | Wang et al. | 324/715 |

* cited by examiner

*Primary Examiner* — Devina Pillay
(74) *Attorney, Agent, or Firm* — Donald E. Schreiber

(57) ABSTRACT

A means for determining the electrical resistance and resistivity of thermoelectric material allows quality control at all steps in the construction of a bismuth telluride and antimony telluride thermoelectric generator. The method involves measuring negative thermoelectric voltage with no current flowing and then a measure of negative thermoelectric voltage while forcing known current through the material in the same direction as shorted to accurately determine thermoelectric resistance. A manual and automatic method of manufacturing thermoelectric rings using forcing current for in-process testing means.

14 Claims, 19 Drawing Sheets

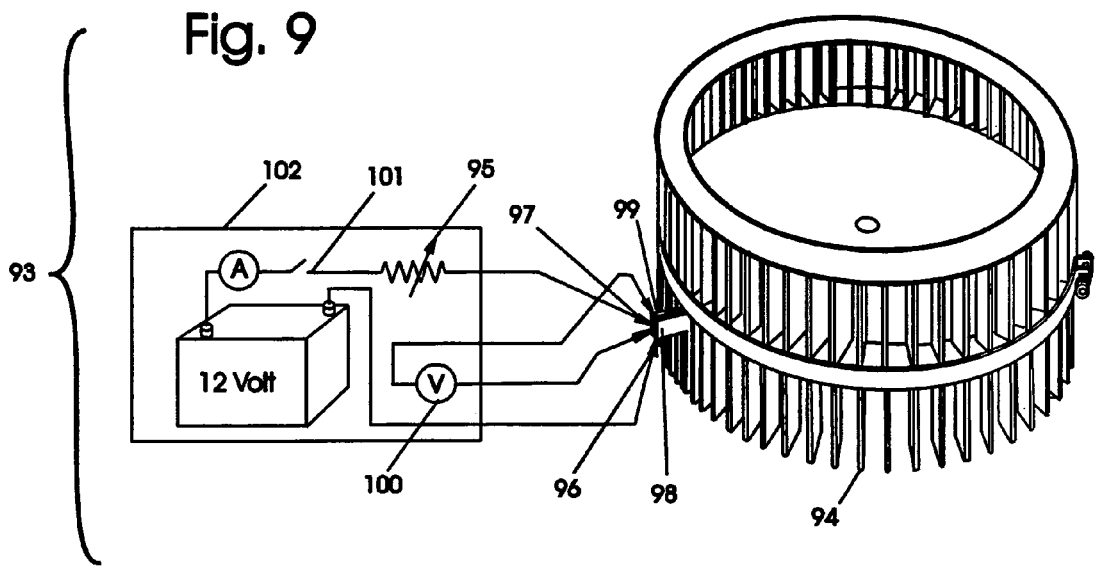
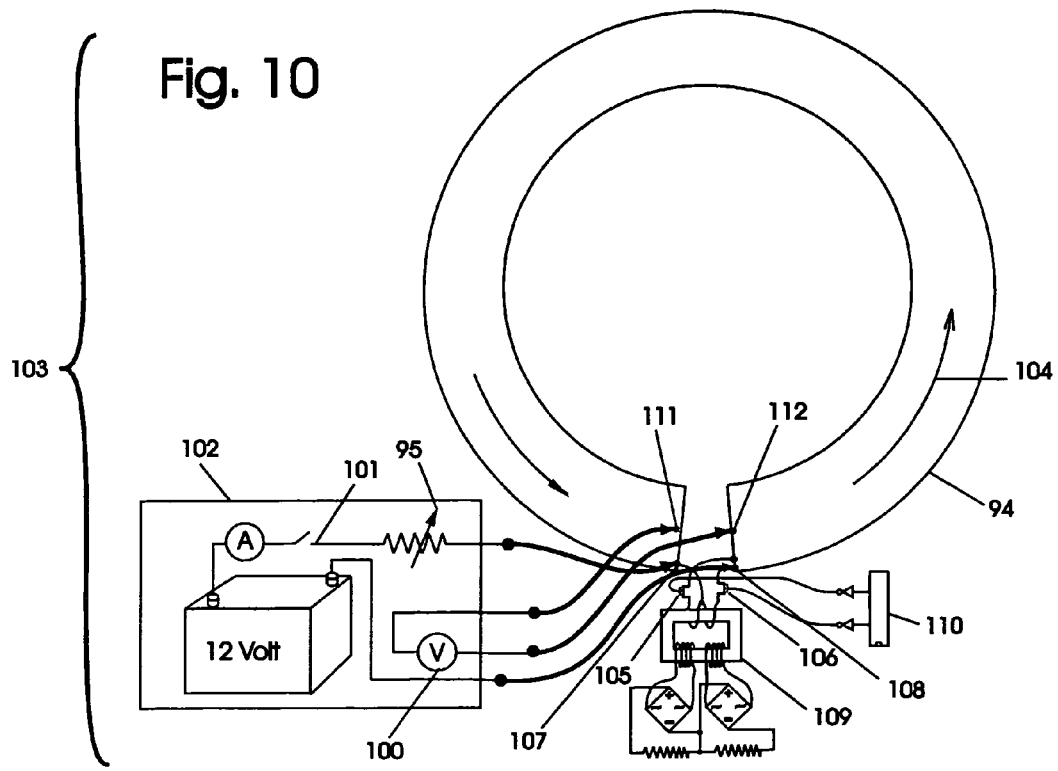

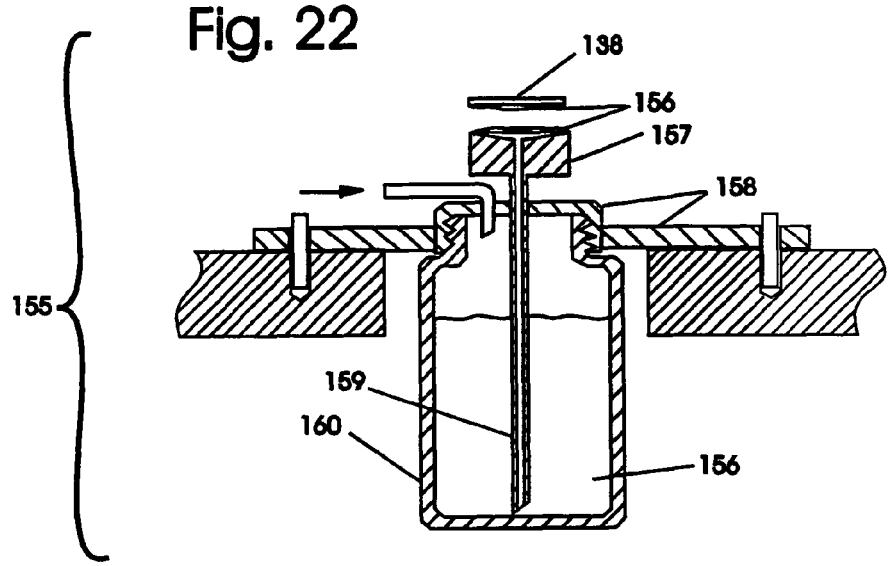
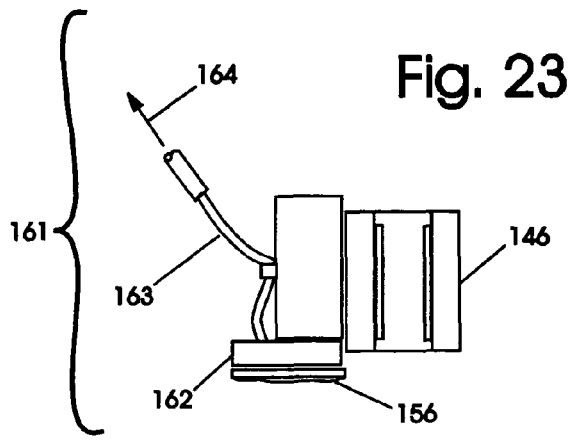
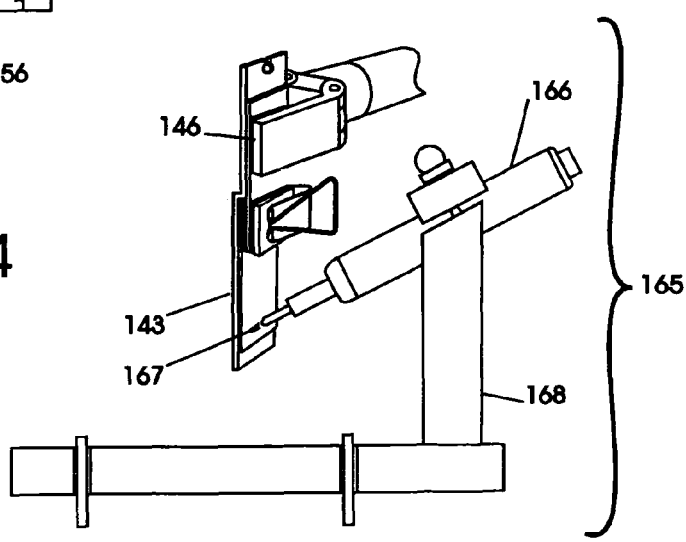

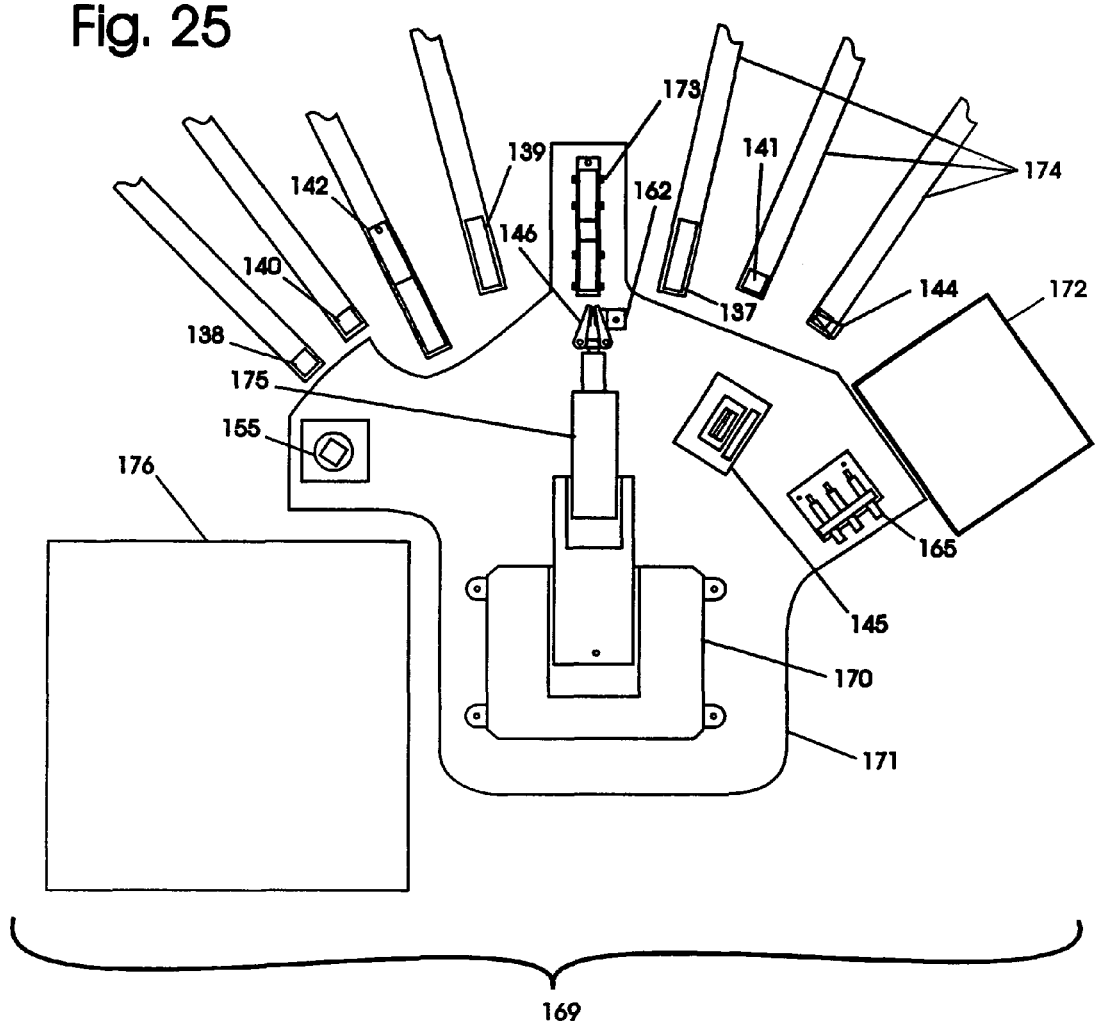

THERMOELECTRIC EVALUATION AND MANUFACTURING METHODS

RELATED APPLICATIONS

Several related applications disclose details for the manufacture of components of bismuth-telluride based thermoelectric elements that comprise thermoelectric generators and thermoelectric chillers. Application Ser. No. 11/517,882 is entitled "Thermoelectric device with make-before-break high frequency converter". United States Patent Application 20030217766 is entitled "Torus semiconductor thermoelectric device" filed Nov. 27, 2003. Improved thermoelectric generators and thermoelectric chiller devices are disclosed in pending patent application Ser. No. 11/259,922 entitled "Solid state thermoelectric power converter" and Ser. No. 11/364,719 entitled "Bismuth-Tellurium and Antimony-Tellurium-Based Thermoelectric Chiller".

TECHNICAL FIELD

This invention relates to methods of assembly and novel testing procedures for the efficient manufacture of thermoelectric generators and thermoelectric chillers. With regard to the testing of components at various stages of manufacture unique methods allow reliable data for producing finished products with few defects. Various classical electrical evaluation methods are normally used for determining thermoelectric properties. Improved methodology involves thermoelectric material operated under heat flow conditions while measuring negative resistive performance.

BACKGROUND ART

The classical way to measure semiconductor and thermoelectrics alike has been to apply a voltage to "force current" through material while measuring voltage drop over a distance through a cross section to determine bulk resistance. The semiconductor industry was founded using V/I, 4-point probe methods to determine material resistance. From a determination of R, it is simple to mathematically determine bulk material resistivity based on resistance and physical dimensions. From Ohm's law, we know that $I=V/R$, $R=V/I$, $R$=resistance, $V$=voltage, and $I$=current. $R=\rho l/A$, where $\rho$=resistivity, $l$=length, and $A$=area. Using the same equation, and with careful attention to units;

$\rho=R A/l$, so given the measured R and the dimensions of the material under the probes, the resistivity $\rho$ (in Ohm-cm) can be easily determined. This methodology has been the gold standard for R and $\rho$ determination for germanium, silicon, and some III-V compounds in semiconductor technology. However, this method has been found to be in error when thermoelectric materials are measured. Measurement values for thermoelectric material have been found to be off by a factor of 2 and more on the high side.

There are problems associated with thermoelectric material measurement. Applying voltage to material under test seems to cause the material to develop a counter voltage that inhibits current flow in thermoelectric material thus changing the expected measurement. Some investigators have suggested pulse methods for determining resistivity measurements, thinking that measurements taken with very short voltage pulses might get around the material disturbance. Errors are found using direct current, pulse, and low and high frequency alternating current methods of measure.

The following disclosure details a method that accurately predicts satisfactory the performance of components as well as the final properties of thermoelectric generators and chillers. A very simple measuring method that predicts exactly the performance of thermoelectric devices is based on operating the thermoelectric material under conditions that simulate actual solid state generator and chiller operation. With thermoelectric material tests under high current operation, the negative resistance characteristics of the material can be accurately determined. Negative resistance was found to have the same V/I slope regardless of the temperature difference, $\Delta T$, and the voltage current ratio, V/I that was measured. Once $\Delta T$ is established in material when measuring negative resistance of thermoelectric material connected to large mass copper heat source and sink, changes in $\Delta T$ occur very slowly, allowing time to make accurate determination of current, and reduced negative voltage caused by the current flow. From measurements of $-V_1$, the voltage when the current, $I=0$ and $-V_2$, the voltage when current is allowed to flow, and the current, $I_{(at-V2)}$, the current at voltage $V_2$ still at temperature $\Delta T$, the negative resistance slope can be easily determined, including the zero-voltage-crossing for material with a particular $\Delta T$. By forcing current to flow through thermoelectric material with $\Delta T$ induced, accurate in-process material measurements can be made. In-process material measurements are absolutely essential to successful, low cost manufacture of solid state generators and chillers, because completed solid state generators and chillers are composed of many elements and ohmic connections. Any element found faulty in assembly can be exchanged for one that performs to specification.

Accurate measurements of thermoelectric material can be made by using the forcing current method to determine negative resistance for heated junctions, with or without metal contacts. Thermoelectric device performance can be measured accurately in ingot, wafer, coupon, and ring form, before and after contact bonding. This method can be used during all stages of assembly and final test, even used for non-destructive evaluation of returned defective product. Because thermoelectric products consist of an assembly of large numbers of elements, numbering into the hundreds and thousands, one faulty or misplaced part can render a sophisticated, high performance solid state generator or chiller useless. This measuring invention has the ability to accurately test elements of the product during assembly, as the product moves along the assembly line, and this makes all the difference in having all products shippable at final test, otherwise realize a less than 10% final test yield.

This invention relates to a measuring system for determining negative resistance in thermoelectric material under thermal operation. Negative voltage measurements made on thermoelectric material while large current is caused to flow along with heat, is different than negative voltage measured with the same heat flow but without current flow. When the current flow through the thermoelectric material is increased until the negative voltage produced by a certain $\Delta T$ is reduced to zero volts, the current through the material is at a maximum for the $\Delta T$ of the device under test. Zero crossing current for the material under test can be increased by increasing $\Delta T$, but the $-V/I$ slope representing negative resistance of the material will stay the same as long as current does not exceed 1,000 Ampere per square centimeter for metal coated contacts. If current through the material is further increased, the voltage becomes zero and then a portion of the current flows in the positive resistance region. With make-before-break, shorted ring thermoelectric generator and chiller devices, the thermoelectric driven ring operates in the negative resistance region and the up-converter and primary portion of the circuit operates in the positive resistance region, forcing current and current drag being equal, or $-V=+V$. This means $-V$ measured across the thermoelectric ring will be driving current and +V measured across the make-before break switch part of the secondary is dragging with the same polarity as a resistor with current flowing in the same direction.

Thermoelectric devices have been used for many years for specific applications where the simplicity of design warrants their use despite a low energy conversion efficiency.

Resistance and resistivity measurements of thermoelectric material are difficult to make because the act of making measurements tends to disturb the material in such a way as to render measured results questionable. When current passes through bulk thermoelectric material, the current also drags heat with the current and this disturbs any voltage readings.

This invention uses heat flow defined by the measuring system, $\Delta T$ determined by the physical dimensions of the device under test and the heat input and heat removed from the device by heat sink. The current passing through the device under test is limited to less than the thermoelectric device could produce on its own if it were short circuited by a super conducting wire. This way, the device operates with heat flow and current, the negative drive voltage at current being less negative than open circuit. Using only this measured data, all electrical parameters can be determined. The measuring technique is simple and accurate, allowing in-process use throughout the assembly, final test and even provides a non-destructive means to analyze customer returns.

Previous to this invention, methods of measure for thermoelectric material included the "Harman Method", as in T. C. Harman, J. H. Chan, and M. J. Logan, J. Appl. Phys. 30, 1351 (1957). These methods were previously considered the gold standard for thermoelectric measurements and investigation.

A survey of measuring methods was made by J. D. Hinderman, "Thermoelectric materials evaluation program", 3-M, Saint Paul. April 1979, NASA/STI Keywords: Evaluation, Technology Assessment, thermoelectric material, thermoelectricity.

Material test methods were also outlined by H. Iwasaki, M. Koyano, Y. Yamamura, and H. Hori, School of Material Science, JAIST, Tatsunokuchi 923-1292, Ishikawa, Japan. Center for Nano Materials and Technology, JAIST, Tatsunokuchi 923-1292, Ishikawa, Japan.

It is a purpose of this invention to provide an accurate in-process evaluation method for determining the heat to electrical energy performance for thermoelectric material beginning with starting materials, carrying through to assembled and bonded devices. It is a further purpose of this invention to provide electrical evaluation for non-bonded and bonded elements that go into the fabrication of a thermoelectric device. It is a further purpose of this invention to provide electrical evaluation for non-bonded and bonded thermoelectric devices at the end points of manufacture.

It is a further purpose of this invention to provide details for manual and automated methods for assembling thermoelectric generators and chillers.

It is a further purpose of this invention to disclose unique manufacturing and assembly aspects for efficient manufacture of thermoelectric generators and chillers.

BRIEF DESCRIPTION OF DRAWINGS

FIG. 9 shows an evaluation method similar to FIG. 8 that can be used to evaluate green un-bonded and bonded thermoelectric rings.

FIG. 10 shows how a completed thermoelectric generator or chiller ring can be evaluated for output capacity, resistance and voltage without a teardown.

FIG. 22 illustrates an automated solder paste dispenser that facilitates the automatic coating of coupon elements and coupons by robotic intervention.

FIG. 23 illustrates a vacuum operated parts pickup device attached to robot jaw used for parts coating and parts placement.

FIG. 24 illustrates a multi-color-marking device to aid in marking parts determined faulty by on-line testing by failure mode.

FIG. 25 illustrates a coupon-making machine capable of assembling, on-line testing, marking, bin disposition, and brazing passed coupons.

DISCLOSURE OF THE INVENTION

To illustrate this invention the figures listed above are drawn to show components of a few implementations of the invention. It should be understood that these figures do not in any way limit this invention as described in the claims.

Figure 1:
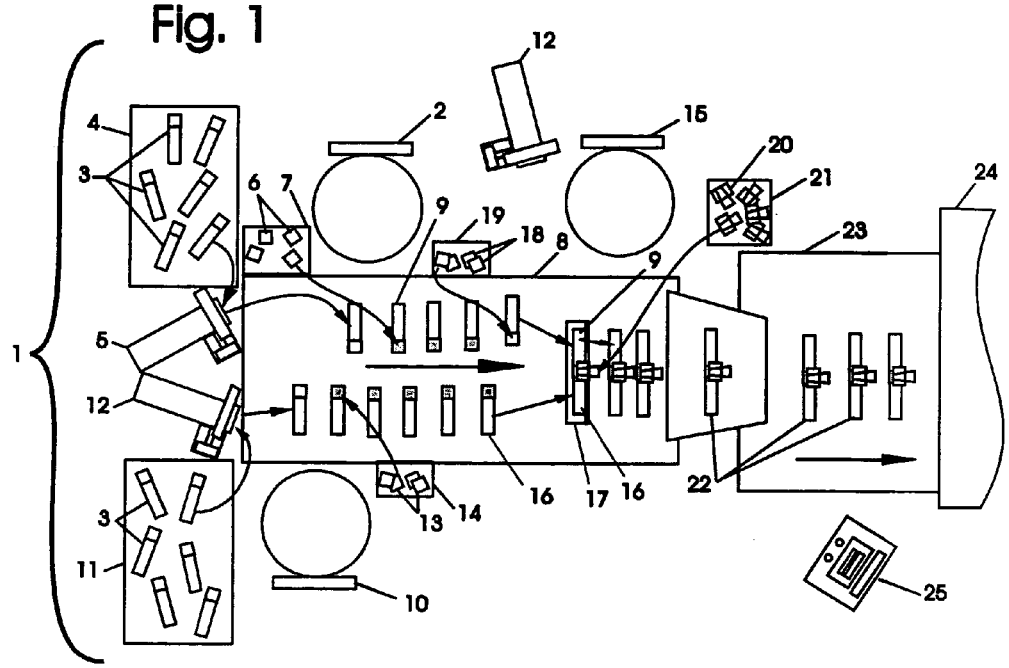
FIG. 1 illustrates the first stages of a manual assembly line method of making thermoelectric rings that provide the current to be converted to standard AC voltages.

FIG. 1 shows the top view 1 of a first phase of an operator assisted assembly line method for making use of wafers, fins and wedge to form ring components of a thermoelectric generator. Operator 2 picks up an offset fin 3 from bin 4 and inserts it in a two-sided paste dispenser 5. The offset structure is shown in detail in FIG. 5. Operator 2 then places p-type wafer 6 from bin 7 on the offset side solder region of fin 3 forming a partially completed p-type hot fin and places it on moving belt 8 forming a wafer hot fin assembly 9. Operator 10 takes a fin 3 from bin 11 and applies paste from one-sided dispenser 12 then places an n-type wafer 13 from bin 14 on the solder applied side of fin 3. Operator 10 then places this assembly 16 on belt 8 with the fin-offset side upwards. Operator 15 first picks up the n-type wafer fin assembly 16 and places it in hand-held alignment template 17. Operator 15 then picks up hot fin-wafer assembly 9 and turns it over placing it over the n-type wafer fin assembly 16 in template 17 forming a straight hot-fin-cold-fin partially completed coupon assembly. Operator 15 then picks up wedge 18 from bin 19 and coats it with a one-sided paste dispenser 12 and places it solder face down over the p-type wafer of the fin-wafer assembly 9 with the wedge taper end facing opposite to the direction of the belt. Operator 15 takes a clamp 20 from bin 21 and secures the completed but un-bonded coupon formed in template 17 to form a competed clamped unbonded coupon 22. Operator 15 places the completely assembled un-bonded coupon 22 on bonding furnace belt 23 of furnace 24. Periodically complete and un-bonded coupons are tested in testing unit 25 to be described in detail below in FIGS. 5, 6 and 7.

Figure 2:
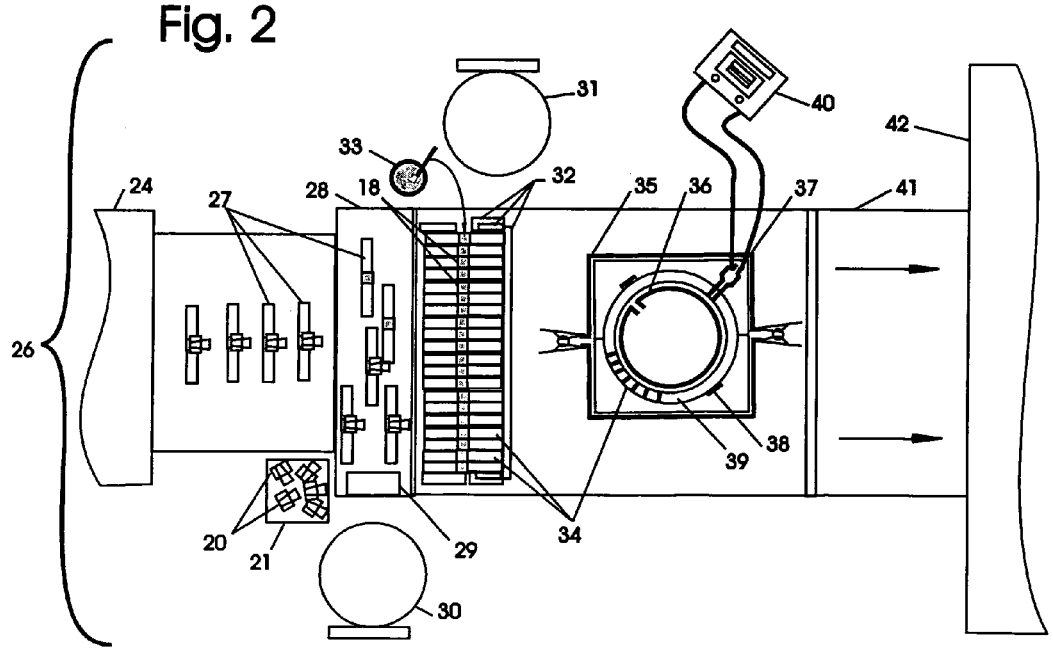
FIG. 2 illustrates subsequent assembly stages for completion of a bonded ring of thermoelectric coupons and an up-converter.

FIG. 2 shows a top view 26 of an operator assisted assembly line method for converting bonded coupon assemblies 27 into a ring component for a thermoelectric generator. Bonded coupons 27 are shown emerging from belt furnace 24 falling into holding chamber 28. Coupons are cooled by fan 29. Operator 30 removes clamps 20 from bonded coupon 27 and places clamps 20 in bin 21 for reuse. Operator 31 places cooled bonded coupons 27 into template 32 where operator 31 applies solder paste from supply 33 to the wedge side of coupon 27. Template 32 is constructed to receive coupons 27 in only one orientation with the wedge side upwards. Operator 30 serially places wedge-pasted coupons 34 into assembly fixture 35. Ring assembly fixture 35 is comprised of internal ring support 36 that supports fins 34 in the vertical position. Fixture 35 has an irregular bottom support that only allows each coupon 34 to be inserted into the fixture in one direction with regard to the wedge side. An up-converter 37 is supported in the assembly fixture 35 at the midpoint of the coupons 34. When the prescribed number of coupons 34 have been installed in ring assembly fixture 35 an insulated compression ring 38 is placed and tightened around the formed ring 39 at the wafer level. Each assembled ring 39 is tested at station 40 prior to thermal bonding of the ring. The details of testing at station 40 are described below in detail. After completion and successful testing of ring 39 using station 40 the ring assembly 39 is removed from assembly fixture 35. The assembled ring 39 is placed on moving belt 41 for thermal bonding in oven 42 where solder-pasted bonded coupons 27 become thermally bonded as a continuous ring when heated to a temperature of 260 degrees C. for 5 minutes.

The above detailed presentation of a preferred manual assembly process is only one of a wide variety of methods that can be used to assemble a completed thermoelectric ring. Other procedures than accomplish the same final assembled product can be developed by those skilled in the art of assembly line processes.

Periodic testing of components in the assembly method described above prevents components from compromising the performance of the final product. The testing portion of this invention comprises a dynamic method for accurate measurement and evaluation for thermoelectric material that can be used throughout the thermoelectric device manufacturing process. The following discussion will show with voltage to current ratio graphical plotting, how a novel forcing current test method for determining negative resistance in thermoelectric material works by describing the significance and meaning of each plot. The discussion of the data demonstrates a simple, quick, and valid way to actively measure thermoelectric properties for several in-process configurations.

Figure 3:
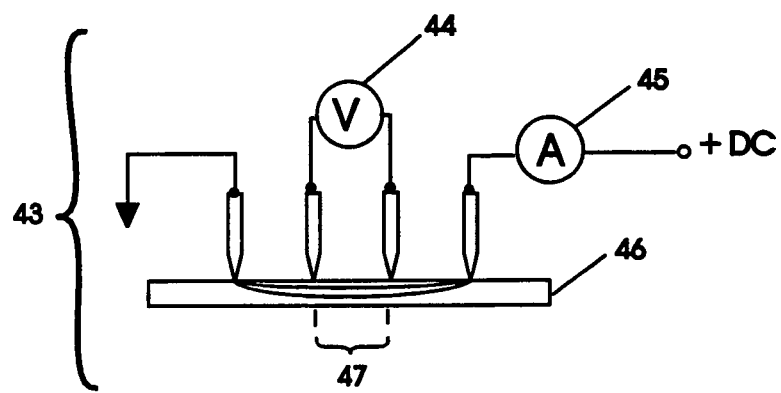
FIG. 3 illustrates the classical method to determine material resistance in wafer form, as used in the semiconductor industry.

FIG. 3 illustrates the classical method of determining material resistance in wafer form, as used by the semiconductor industry. Resistance is calculated using the voltage to current ratio, V/I, data along with physical dimensions of the material under the probe, i.e., the distance 47 between voltage probes. Determination includes wafer thickness and an estimation of current spreading in the wafer, along the test sample's width. Test apparatus 43 uses voltmeter 44 and ammeter 45 to measure wafer 46 using a constant current source of approximately 0.1 ampere while measuring the voltage. From wafer thickness, measured voltage from voltmeter 44, known current from ammeter 45, and the spacing 47 between voltage probes the resistance in the vertical direction of the wafer can be calculated. Resistivity can be determined mathematically using Ohms law and the definition of conductivity, ρ, in Ohm-cm. This analysis can only be made on wafers without metal contacts. Wafers with metal contacts must be tested by other means that require either the removal of metal contacts or taking into consideration the conductivity of the metal contacts. The values obtained for semiconductor material differ widely from those obtained using the same procedure with thermoelectric material. A novel method for determination of the electrical characteristics of thermoelectric material is described beginning with FIG. 5.

Figure 4:
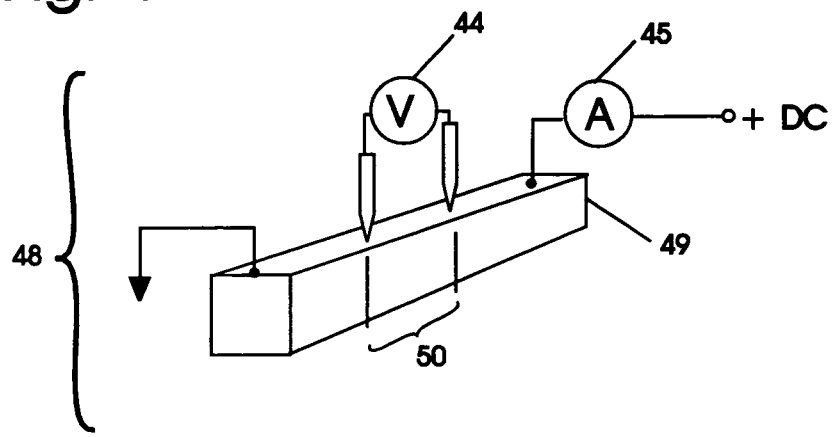
FIG. 4 shows how a silicon ingot can be measured using a constant current source to determine material resistivity.

FIG. 4 shows the classical means 48 for measuring electrical characteristics of a silicon ingot 49 using voltmeter 44 and ammeter 45 with a current source. Knowing the distance between probes 50 across the voltmeter probes, the resistance of sliced wafers from the ingot 49 can be determined in advance of slicing.

Figure 5:
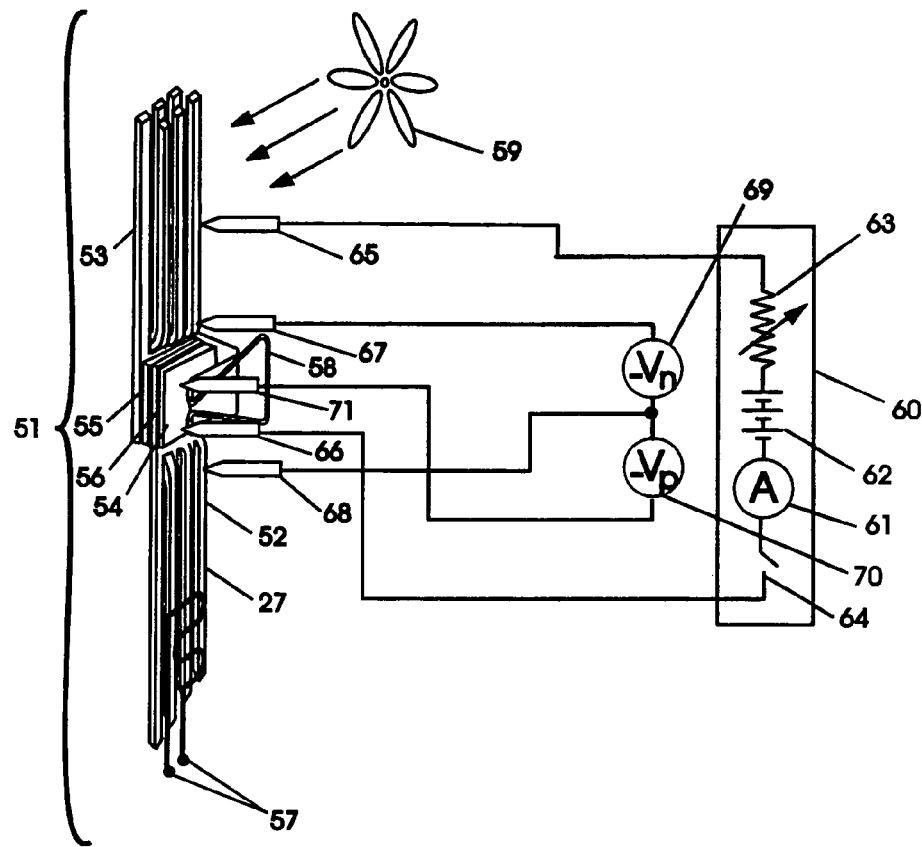
FIG. 5 shows a fixture for testing a novel forcing current bench test method that can be used to accurately determine thermoelectric wafer and coupon performance.

FIG. 5 diagrams a test system 51 that more accurately predicts thermoelectric behavior in wafers with and without metal contacts, coupons bonded and non-bonded, and thermoelectric rings bonded and non-bonded more accurately than semiconductor methods. The forced current technique with heat flow produces valid, reproducible measurements throughout thermoelectric assembly process. Measuring system 51 is used in FIGS. 1 and 2 as in-process test instruments 25 and 40. In FIG. 5 resistance is being measured for a coupon 27 consisting of hot fin 52 shown with offset pins, cold fin 53 shown with offset pins, tapered wedge 54, n-type wafer 55 and p-type wafer 56. Components of test system 51 include heater 57, clip 58, fan 59, and a constant current power supply 60 consisting of an ammeter 61, power source 62 and a means to vary current 63, and momentary switch 64. Probe 65 and probe 66 apply current from power supply 60 to cold fin 53 and wedge 54. Probe 67 and 68 connect voltmeter 69 across cold fin 53 and hot fin 52 respectively to measure n-type wafer 55. To analyze the p-type wafer 56, voltmeter 70 connects across hot fin 52 and wedge 54 with probes 68 and 71 respectively. Heater 57 heats hot fin 52. Fan 59 blows air on cold fin 53 to remove heat to ambient.

Measuring instrument 51 is used to accurately determine thermoelectric wafer and coupon performance for various stages of assembly. The internal resistance of the thermoelectric wafer material, wafer contacts through heat conducting nickel coated copper fins can be obtained. The heater 57 is used to heat the hot fin of a thermoelectric coupon causing heat flow through p-type and n-type wafers. Heat flows through thermoelectric wafer material conducting through wafers to cold fin 53 and wedge 54 heat drawn with the assist of fan 59. Voltage across the n-type wafer of the coupon is measured with probe 67 on the cold fin and probe 68 on hot fin 52. Voltage across the p-type wafer of the coupon is measured with probe 68 on the hot fin and probe 71 on wedge 54. As the heat begins to flow from hot fin 52 through the n-type thermoelectric material of the coupon to cold fin 53, this also heats the p-type wafer 56 with heat traveling to the wedge 54. The voltage determines the temperature differential just as a thermometer or thermocouple. The negative voltage with no forcing current flowing is measured using meter 69 is recorded to measure n-type negative voltage values at a heat flow through coupon 27. Negative voltages are obtained first with no current flowing through momentary switch 64 of power supply 60 in the off position. Meter 69 is used to measure n-type negative voltage. Meter 70 is used to measure p-type negative voltage. Momentary switch 64 in power supply 60 is closed and negative voltage measurements are again noted along with the current from power supply 60. Reduced negative voltage measured with voltage meter 69 and 70 are obtained by proper connection of the power supply leads from forcing current supply 60. This convention allows voltage values to be less negative when current is applied from power supply 60. The momentary switch 64 activated and new negative voltage recorded for each voltmeter 69 and 70 at known current, the internal resistance of n-type, p-type and coupon can be mathematically determined from the voltage and current measurements. The resistance data can be used to pass or fail a wafer, coupon or even a thermoelectric ring before thermally bonding. Testing thermoelectric elements in process saves material and increases final test yields of thermoelectric rings composed of 300 and more perfect elements for proper operation.

Figure 6:
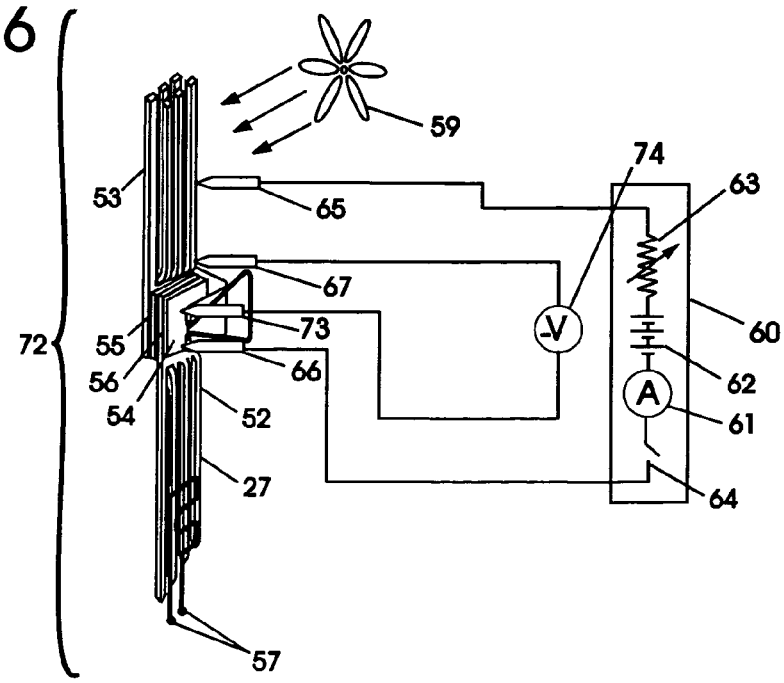
FIG. 6 shows the electronic circuit of FIG. 5 where both p-type and n-type wafers can be evaluated simultaneously.

FIG. 6 shows a test system 72, similar to test system 51 except only one volt meter 74 is used with probes 73 and 67. In this case voltage drop toward zero when forcing current enabled represents both n-type and p-type wafers in series, therefore the resistance of the complete coupon in the bonded or un-bonded state can be determined.

A typical coupon has a hot fin 52, a cold fin 53 and a wedge 54. The wedge 54 can be used as a temporary heat sink to allow quick evaluation of thermoelectric material attached to wedge 54 while it is cold and before it soaks too much heat to operate as an effective heat sink. This way, the material attached to the wedge can be evaluated using the forcing current method if measurements are performed quickly, the wedge serving as a temporary heat sink for short duration until it becomes too heated. If tests are performed quickly, the resistance is calculated from the voltage-current ratios, V/I. These ratios define the slopes for both types of materials, n- and p-type. Resistance standards are set for a coupon to pass quality assurance testing.

Figure 7:
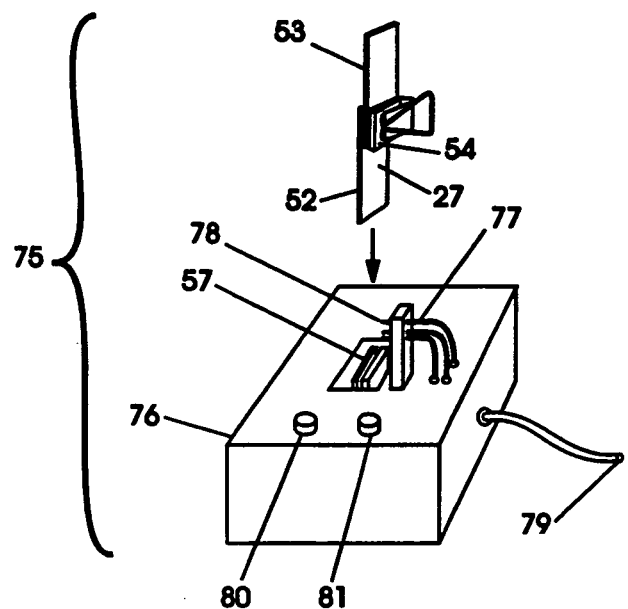
FIG. 7 shows how a coupon is measured with a go-no go test fixture.

FIG. 7 shows production fixture 75 in box 76 providing current probes 77 and voltage measuring contacts 78 to collect data from n-type and n-type material in coupon 27. This method lends itself to automation under computer control with umbilical 79. Fixture 75 can also incorporate a temporary heat sink adjacent to the coupon's wedge 54 to remove heat equally across both wafer types. FIG. 7 illustrates how the test procedure of FIGS. 5 and 6 can be packaged in box 76 to conveniently evaluate non-bonded and bonded coupons as a part of the assembly line process. Under computer control negative voltage is measured after the coupon achieves a pre-set temperature between wedge 54 and cold fin 53, the −V1 recorded, current forced and −V2 measured at known current I. A computer computation is automatically made resulting in the illumination of either green go-lamp 80 to indicate pass or red no-go lamp 81 to indicate the coupon resistance value exceeds operating limit for proper thermoelectric ring operation.

Figure 8:
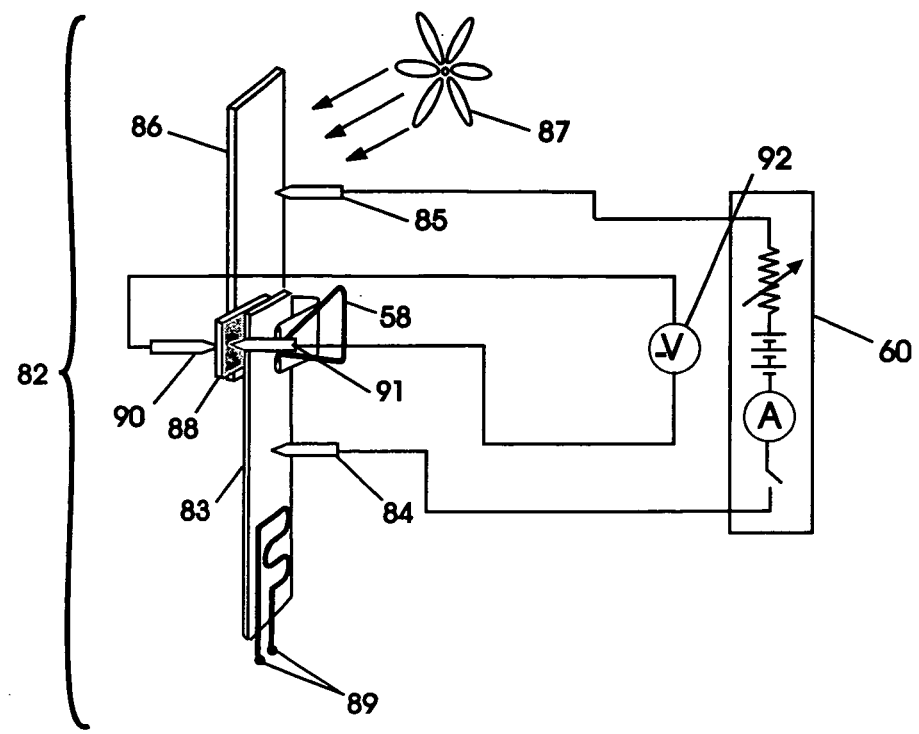
FIG. 8 shows how a raw and coated wafer can be evaluated with a test system.

FIG. 8 shows an apparatus 82 for using the forcing current power supply 60 of FIG. 6 connecting to hot fin 83 through probe 84 and probe 85 to cold fin 86 cooled by fan 87. Raw thermoelectric n-type and p-type wafers as well as a wafer 88 with metal coating on wafer 88 can be evaluated this way. Individual non-bonded thermoelectric wafer 88 is aligned so as to protrude from hot fin 83 heated by heater 89. Protruding wafer 88 is cooled on the other side by cold fin 86. Voltage probes 90 and 91 from voltage meter 92 make contact with the bare or coated wafer 88 or metal coating on wafer 88. The same measuring technique used in FIG. 6 allows determination of individual wafer resistance parameters with and without metal coating.

FIG. 9 illustrates a measuring system 93 for determining electrical resistance in an assembled thermoelectric ring before bonding and after bonding. System 93 with box 102 shows a constant current source 95 connected by contacts 96 and 97 to power output leads 98 and 99 of ring 94. Voltage meter 100 also connects to output terminals 98 and 99 on the ring 94 side of current forcing connections 96 and 97 so as to be independent of the contact resistance of the current source terminals. The hot fins of the ring are heated and negative voltage of ring 94 is measured at temperature with voltage meter 100 and the value recorded as −V1. Momentary switch 101 is closed and the negative voltage, −V2, of ring 94 is recorded as measured with meter 100 at current I produced by constant current power supply 95. From −V1, −V2, and the current at −V2, the internal resistance of ring 94 is determined. The same forcing current test method can be used as a nondestructive evaluation method for generator products returned from the field as shown in FIG. 10. A thermal gradient is first applied to the open circuit thermoelectric device 94. A thermoelectric negative voltage measurement is then made with the open circuit ring on terminals 98 and 99, with zero current flowing. The accumulated voltage is indicative of $\Delta T$ between n-type and p-type wafers connecting the hot and cold fins for the ring 94 as a first measurement. This measurement is actually a negative voltage, $-V_1$, produced by $\Delta T$ that is caused by heating the hot fins and cooling the cold fins with momentary switch 101 in the open condition. The momentary switch 101 is closed to force approximately 50 amps from box 102, through the high capacity load resistor 95 properly adjusted to serve as a constant current supply. By proper application of voltage meter 100 leads to ring 94 to output leads 98 and 99, −V1, −V2 voltage can be measured. Current flows momentarily through the thermoelectric ring 94 under test in the same direction current would normally flow if the thermoelectric device were shorted on itself or operating the primary windings of an up-converter through MOSfet switch banks. When forcing current flows through the thermoelectric device, the open circuit negative voltage −V1 is reduced and is made more positive, as −V2 with application of known current. The second negative voltage −V2 is recorded, along with the magnitude of the actual forced current I from power supply load resistor 95 flowing through the ring device 94. From the −V1, −V2 and the resistance of the ring can be calculated.

FIG. 10 shows apparatus 103 that represents a thermoelectric generator ring 94 with complete electronic drive and switch circuitry attached. Heat flow through hot fins to cold fins causes current 104 to flow in the ring 94 when MOSfet switch banks 105 and 106 are switched "on" and conducting current through ring 94. Ring current is maintained continuous by thermoelectric effect in only one direction 104 by normally open make-before-break switches 105 and 106 located across power output terminals 107 and 108. Current direction around the high frequency magnetic core 109 is switched oppositely by electronic circuit elements driven by inverted drive from the pulse width modulator chip 110. Forcing current tests can be made to the heated ring 94 of a thermoelectric generator by measuring across the thermoelectric ring output terminals 107 and 108 with MOSfet switches 105 and 106 in the inactive normally open mode. Forcing current from power supply 95 as in FIG. 9 allows voltage probe measurements to be made at terminals 111 and 112 with voltage meter 100. Voltage −V1 is measured with voltmeter 100 on ring 94 with hot fins heated and cold fins cooled and with zero current. Voltage −V2 measured with volt meter 100 with forced current from momentary switch 101 switched current source 95 allows the determination of internal resistance of ring 94 from calculation including current 104 I at voltage −V2. This measurement of the thermoelectric ring can be made with and without electronic drive circuitry connected with electronic drive inactive. Initially MOSfet switch banks 105 and 106 are normally open when pulse width modulator chip 110 is open and inactive. Voltage probes 111 and 112 from voltmeter 100 are connected across positions 107 and 108 but closer to the ring. The probes 111 and 112 are connected with polarity to indicate a minus voltage V1 when the ring is heated and the MOSfet switches are open. The hot fins of the ring are heated and voltage across the ring is measured with the voltmeter 100 connected to result in negative voltage values. The voltage value is noted as $-V_1$ with no current in the ring. Momentary switch 101 is closed to force a known amount of current, I, about 50 amps through ring 94. This reduces negative voltage −V1 to a higher value, that is, less negative voltage as recorded from voltmeter 100 and designated $-V_2$. From the values $-V_1$ and $-V_2$ and measured current I, the resistance of the ring is calculated. The resistance of the ring of 60 coupons should be less than 0.001 Ohms, both before and after solder paste bonding.

The relevance of the test method was demonstrated using the material from a thermoelectric material library developed over a five-year period of time when wafer contact research was conducted. Samples from this library were re-measured over and over using the negative voltage, forced current method, comparing these results to classic 4-point and voltage current ratio methodology. The negative voltage, forced current method is by far the most accurate and can be used all along the production process for quality assurance. The examples below provide detail data to illustrate the methods and provide quality values for n-type wafers, p-type wafers, coupons, thermoelectric rings and thermoelectric generator.

Figure 11:
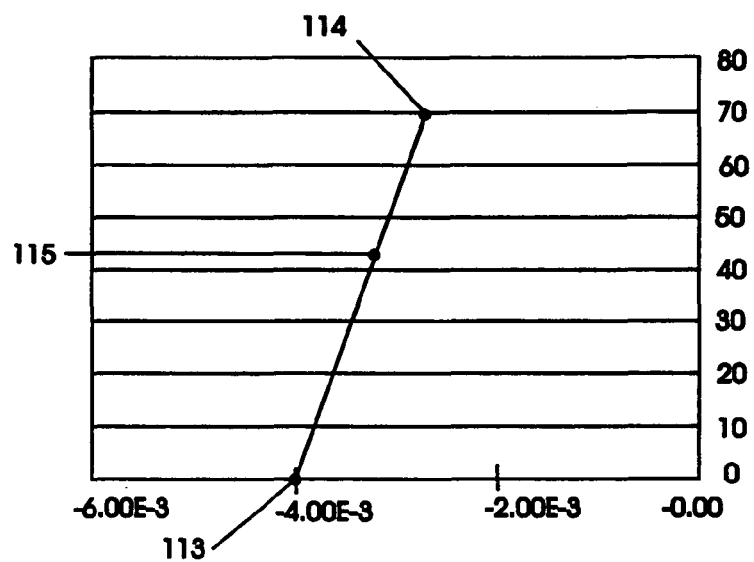
FIG. 11 shows how the slope of the V/I line represents a negative resistance of −1.04E-5 Ohms to mean that current can flow in this region without resistance until the negative driving voltage −V becomes a positive voltage on the right side of zero volts on the chart.

FIG. 11 shows the slope of the voltage to current line, V/I line, representing a negative resistance of −1.04E-5 Ohms when a hot fin of a coupon is heated. A negative voltage of −4E-3 was measured as −V1 at 113 with no current flowing. With a forcing current of 71 amperes, a −V2 voltage of −3.0E-3 at 114 is recorded. Power supply 60 in FIG. 8 causes current flow in the same direction current would flow if coupon were shorted. A negative voltage in this region means that current can flow in a thermoelectric ring without resistance, up until the time the thermoelectric driving voltage becomes positive voltage, crossing zero from the left side of the graph to operate in the positive side (right) of zero on the X-Y chart. The slope of the line represents resistance (V/I) and because voltage is negative, −V/I represents negative resistance operation. When a current of 71 amperes is forced through the coupon in FIG. 11, the negative voltage is reduced to −3.0E-3 shown as sloping line 115. This data: −4.0E-3 volts, 0 amps and −3.1E-3 volts, 71 amps, amounts to a resistance of −1.04E-5 Ohms as calculated. The resistance is negative because voltages are negative and the current is in the positive direction that the up-converter allows current to be driven in the ring.

Figure 12:
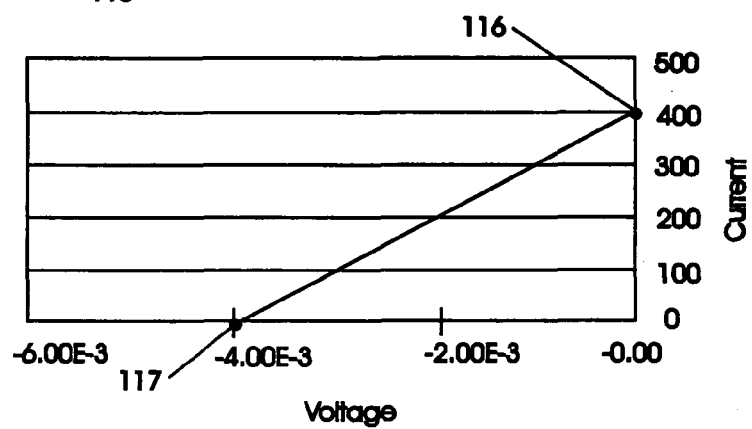
FIG. 12 shows what happens to thermally induced junction(s) voltage when a fixed current is forced in the direction that current would normally flow if the junction(s) were short-circuited with a piece of super-conducting wire where the negative voltage decreases becoming zero at a current of 385 Amperes.

FIG. 12 shows that the same resistance values are derived when the forcing current is increase to the point that −V2 becomes zero at a current of 385 amps at 116. Before current is applied to the device under test with a thermal gradient present using either a heater block or the flow of hot air across hot fins, the coupon produces a voltage of −4E-3, and a zero current at 117. A forcing current of 385.5 moves V1 voltage from −4.E-3, zero current to a −V2 at zero volts, 116. The forcing current of 385.5 is the same current at zero crossing that would occur if the heat-induced ring were shorted with a micro-ohm short. This performance is measured for a single thermoelectric wafer of a 2-wafer coupon plotted as tested in FIGS. 5 and 6 with a $\Delta T$ of approximately 80 C. Metal-coated wafers can also be accurately evaluated for electrical performance using the test setup shown in FIG. 8 by measuring voltage on protruding wafer sides rather than on the thermal or current driving connections. FIG. 12 also shows negative voltage ($-V_1$, $-V_2$) data plotted against currents zero and I at V=0, on X-Y coordinates with thermoelectric junction(s) maintained at an arbitrary ΔT by heater 87 in FIG. 8.

Figure 13:
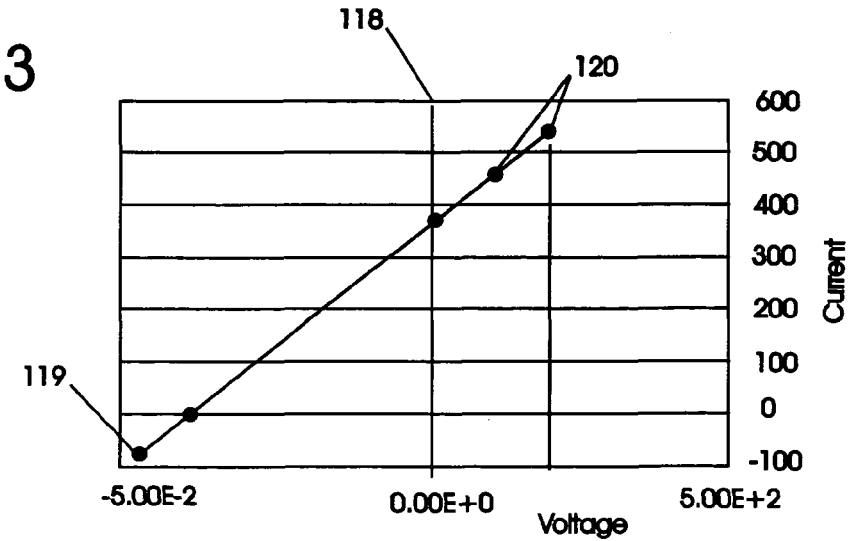
FIG. 13 shows what happens when current is increased beyond the zero-voltage crossing point (385.5 amps), negative voltage becomes positive voltage to the right of zero-volts and system resistance also becomes positive.

FIG. 13 shows the thermoelectric junction of FIG. 12 when forcing current is further increased beyond that of zero-crossing 118. The voltage becomes positive as the current increases beyond that of zero crossing as at points 120. Current is forced beyond that of zero crossing for thermoelectric material at a set ΔT. The forcing current is in the direction current would normally flow if the junctions were short-circuited with a piece of super-conducting wire. Rather than pushing the current higher each time to achieve a zero crossing, V=0, a zero crossing can be easily calculated using the measured data $-V_1$, and $-V_2$, and then measuring I at $-V_2$. The linear equation Y=mX+b can be used to determine V/I which is −R, which is also the slope of the line and the resistance of the device under test. One value at 119 shows −V with negative current. This condition occurs when forcing current in the ring is reversed. The linearity of the slope of voltage to current is seen for 5 measured points, 2 of which at 120 show positive voltage values. The resistivity (ρ) can be accurately obtained by ρ=R(A/L), which is resistance, times the area of the wafer, divided by the wafer thickness, all in centimeters, because the units for ρ are defined as being Ohm-cm in the SI system.

Figure 14:
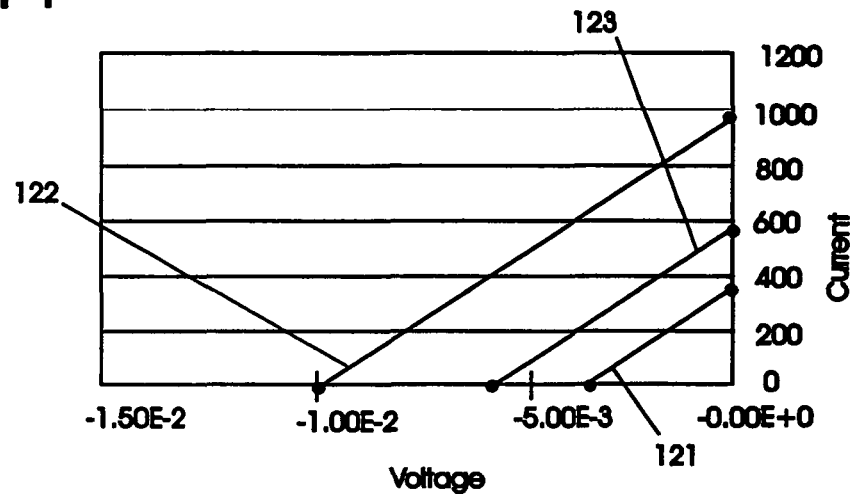
FIG. 14 shows what happens in the negative resistance region when the $\Delta T$ across the thermoelectric material is changed, V/I slope stays the sane while negative voltage and current at zero-crossing change.

FIG. 14 shows −V/I plots for various ΔTs for the same thermoelectric junction for the wafer measured in FIG. 11. The −R is the same for the material regardless of ΔT because all V/I slopes are parallel. For each line a different temperature was used for which a zero voltage current applies. At each different temperature differential the forcing current was applied until the voltage became zero. The calculation for resistance is the same because each slope 121, 122, and 123 are the same. This shows that any differential temperature between hot fins and cold fins can be used to analyze wafer, coupon, and ring resistance.

Figure 15:
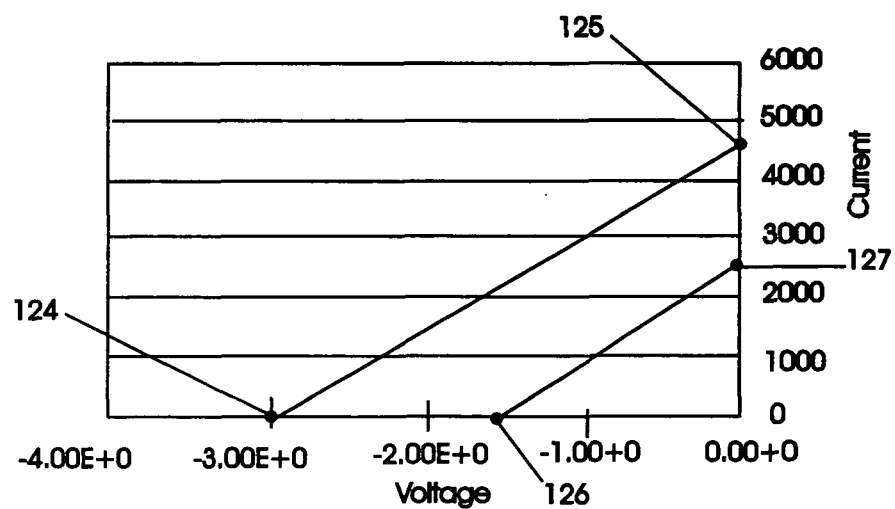
FIG. 15 shows a V/I plot for a ring with 60 n-type wafers and 60 p-type wafers arranged as a ring as the $\Delta T$s for thermoelectric material junctions are changed.

FIG. 15 plots values measured for a thermoelectric ring of 60 coupons. The hot fins are heated and the cold fins cooled to produce −V1 shown at 124, which amounts to −3 volts when the ring is open circuit and a self-induced current of 4,808 amperes due to ring shorting at 125. The ring was then shorted partially by placing an up-converter with a resistance of +6.0E-4 Ohms, not shown, across the ring terminals. This addition reduces −V1 to −1.5 volts shown at 126. The up-converter's resistance is mostly in the switch bank that is composed of parallel-connected MOSfets switches. Two make-before-break MOSfet switch banks allow 2,500 amperes to flow through the ring as shown at 127. The same current produced in the ring circulates through ring shorted by up-converter.

The R slopes 124, 125 in FIG. 15 are at a particular junction temperature differential for the ring. This represents the internal resistance for the ring. The X-Y line shifts to the right when the load of the up-converter is connected. If junction temperature differential is increased, the loaded −V1 becomes more negative, increasing the current in the up-converter. Wafer contacts are a limiting factor for the amount of current a ring may circulate reliably. Nickel contacts on tellurium based thermoelectric wafers have been found to operate reliably at 750 amps per square centimeter. Shorting of a thermoelectric ring on itself can lead to high current catastrophic ring failure. To operate properly at high power level, thermoelectric generator material must have proper metal contacts to have high current capacity. A load resistor must always be placed in series with a ring when shorting to prevent over-current destruction. An up-converter used as an output device for a thermoelectric ring can modulate ring current at a safe and continuous controlled current in the ring portion of the generator.

Figure 16A:
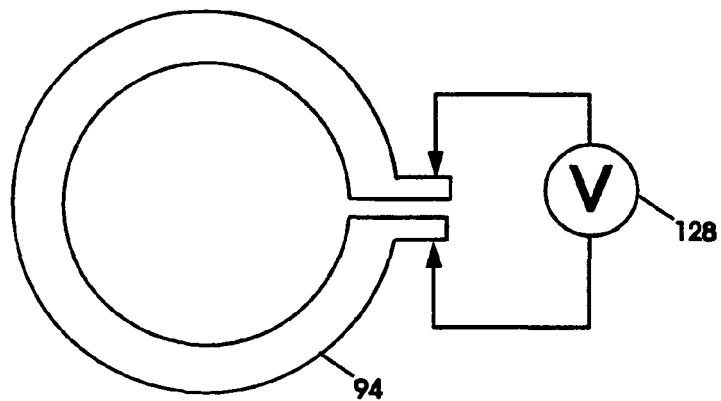
FIGS. 16a, b, and c shows how a thermoelectric ring can be evaluated open-circuit voltage as in 16a, in 16b with shorted current and in 16c as a thermoelectric ring with up-converter attached.
Figure 16B:
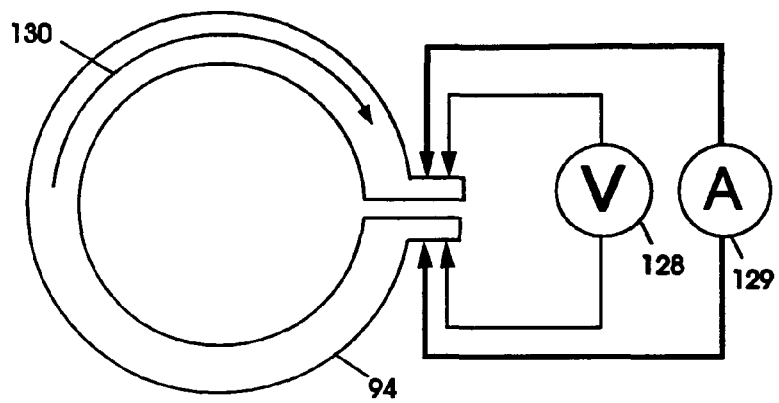
Figure 16C:
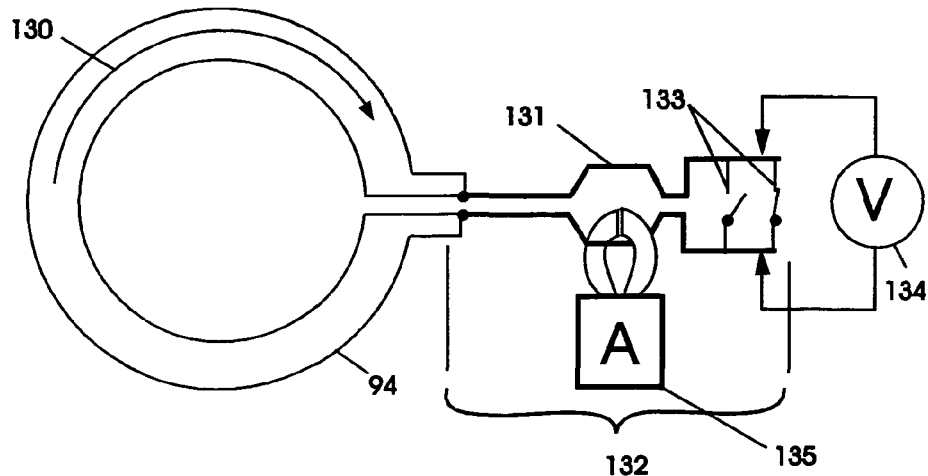

FIGS. 16a through 16c illustrates three different test modes for a heat driven thermoelectric ring 94. FIG. 16a shows heated and cooled thermoelectric ring 94 in open circuit mode with current being zero. Thermoelectric ring 94 is made up of 60 bonded coupons 27 that measure −3 volts open circuit with voltmeter 128.

FIG. 16b illustrates another test mode for heat induced ring 94 described in 16a. FIG. 16b shows ring 94 operating in the ring-shorted mode with heavy-duty ammeter 129 conducting and measuring current 130 in ring 94. Voltage across ring 94 is measured with voltmeter 128 and found in this test to be zero. Current 130 circulating in ring 94 in shorted mode is 4,808 amperes as measured with ammeter 129 and plotted in FIG. 15 as 125.

FIG. 16c illustrates a test mode for heat induced ring 94 described in 16a and 16b connected to secondary winding 131 of up-converter 132 with two ultra-low impedance make-before-break MOSfet switch banks 133. Resistance of each of the make-before-break MOSfet switch banks 133 is on the order of 6.0E-4 Ohm or 0.0006 Ohm. When a current of 2,400 Amperes flows through switch bank 133 driven by voltage from partially shorted ring 94, voltage meter 134 measures +1.5 volts across switch banks 133. Heat induced thermoelectric ring 94 uses roughly half of the open-circuit voltage to force current through up-converter primary winding 131 and switch bank 133. This can be verified using voltmeter 134 and current meter 135. High frequency, 50-kHz to 200-kHz, overlapped switching is required for efficient, switching power supply energy transformation, ring to secondary output windings. The on-resistance of the MOSfet switch banks can be varied with the number of MOSfet switches used in parallel. This is the same technique used to limit ring current through each switch bank. A typical resistive load for a 60 coupon thermoelectric ring connected to up-converter is 6.4E-4 Ohms for each switch bank which limits ring current to approximately 2,400 Amperes while the generator is operating. Ring-generated current flows due to the difference in temperature from one side of n-type and p-type wafers, which creates voltage. Energy output from the ring-driven up-converter can be adjusted by changing heat flow through ring 94, which varies temperature differential across each thermoelectric wafer. With heat flow adjustments voltage can be regulated, current adjusted by the number of switches used, controlling the energy output of ring 94.

A simple way to calculate potential output of a closed-loop type shorted thermoelectric generator is to use the following equation:

$P_o = V^2/R$; where $P_o$ is the potential power in the ring over time, V is the open circuit voltage of the ring squared, and R is the resistance or AC impedance of the up-converter and MOSfet switch-bank.

Typical values for a 5-kW generator are: $P_o = (3)^2/1E-3 = 9,000$ Watts

This energy is achieved with a 9-inch diameter thermoelectric ring 94 made up of 60 coupons 27, with an operating ΔT of approximately 200 C. Transformer losses in the switching up-converter system is from heat dissipated in the MOSfet switches, magnetic core losses, and primary winding losses in the up-converter circuit. Roughly 5-kW of useful energy output is realized from 9-kW circulating in the ring as potential energy. To increase this output, ΔT across wafers can be increased to 250 C however no test data exists at this time to support reliable operation beyond a 250 C ΔT.

Another way to increase generator output performance is to manufacture a larger diameter ring made up of a larger number of the same coupons 24. A 24-inch diameter ring has been modeled with an output capacity of 333-kW, 400-hp, that uses the same wafers and heat transfer elements as the 9-inch ring. A 13" diameter ring, estimated to produce 150-kW or 200-hp, would satisfy electric automotive requirements.

The forcing current evaluation method uses three simple to obtain measurements. The are; $-V_1$, $-V_2$ at I, and I (at $-V2$) to determine R. The exact $\Delta T$ of the measurements is unimportant because temperature changes occur slowly due to large copper mass of coupon fins. To determine R for a combination of coupons, the test circuit shown in FIG. 5 is used. Heat is applied to one side of the junction(s) while the other side(s) is cooled or remains cooled. An automotive starter relay with a foot-switch is used to force current through the junction(s) in the same direction current will flow when ring elements are driving up-converter. Test current flows through load resistor, the device under test, and back to battery ground. Should $-V$ become more negative across the device under test with current application, the polarity of the forcing current is backward, but the results will still predict the correct R. The apparatus of FIGS. 5 through 10 is reliable for several months of use, after which test fixture can either be overhauled with new parts or discarded and completely replaced. From the open circuit $V_1$ at $\Delta T$, $I_0$, and then $V_2$ at the same $\Delta T$ with current flowing through the junction(s) the R and the $\rho$ of the material can be calculated using the equation Y=m'X+b. The $-R$ for a completed circuit or ring can also be calculated. From these results, everything is know to predict the performance of a thermoelectric generator operation from the beginning as a material ingot, raw wafers, wafers with metal contacts, assembled into coupons, and as a ring at final assembly and for product rings returning from the field as defective. If a coupon 34 is found during assembly that functions below acceptance level, it can be scrapped, replaced with one that operates in the normal performance range. The test apparatus described in FIG. 5 through 10 was used to determine R, $\rho$, and zero crossing current based on a library of material samples cataloged over five years.

In a preferred embodiment the quality of wafers are tested before being assemble in a coupon arrangement. The power output performance Po of a completed thermoelectric coupon, or generator is a function of the summation of the voltages squared, caused by the temperature differential of individual wafers of the coupon or coupons of the ring, divided by the sum of the resistances of individual wafers, and wafer connections in the coupon that make up the ring; Po=$V^2$/R. Therefore, thermoelectric wafer(s) and wafer connections within useful coupons must have resistances in the sub-micro-Ohm range to perform well as a ring. For control of voltage in the build cycle, incoming thermoelectric wafers are measured using a temperature-controlled soldering iron as a hot-point probe. The probe is placed on a wafer's topside surface as a negative connection to a digital voltmeter. The plus connection of the digital voltmeter is connected to a room temperature heat sink that maintains the bottom surface of the wafer at room temperature. A hot-point-probe measurement of 0.055 volts is typical for either p-type or n-type wafer when the soldering iron is controlled at 250 C, and the room temperature at 25 C. The polarity of the voltage measured in this way is positive for p-type and negative for n-type wafers. The in-process measurement system of this patent is all about measuring and selecting of coupons consisting of cold fin, n-type wafer, hot fin, p-type wafer, and conductive wedge to form a coupon. Coupons that are assembled as a ring in a thermoelectric generator then operate with predictable electrical power output performance. This evaluation method can determine go, no-go performance for individual wafers, individual coupons and assembled coupons of a ring. Being able to remove high resistance coupon components from the build cycle allows the passing of only acceptable performance elements for building generator rings. This is a very important procedure because should a single coupon in the building process have an internal resistance much higher than all others, the power output of the completed ring is degraded.

Manual assembly methods for coupon and ring manufacture are illustrated in FIGS. 1 and 2. These methods can be replaced with automatic methods that test parts as they are manufactured and remove failed parts from line. FIGS. 17 through 31 describe a robotic means of building and testing rings.

Figure 17:
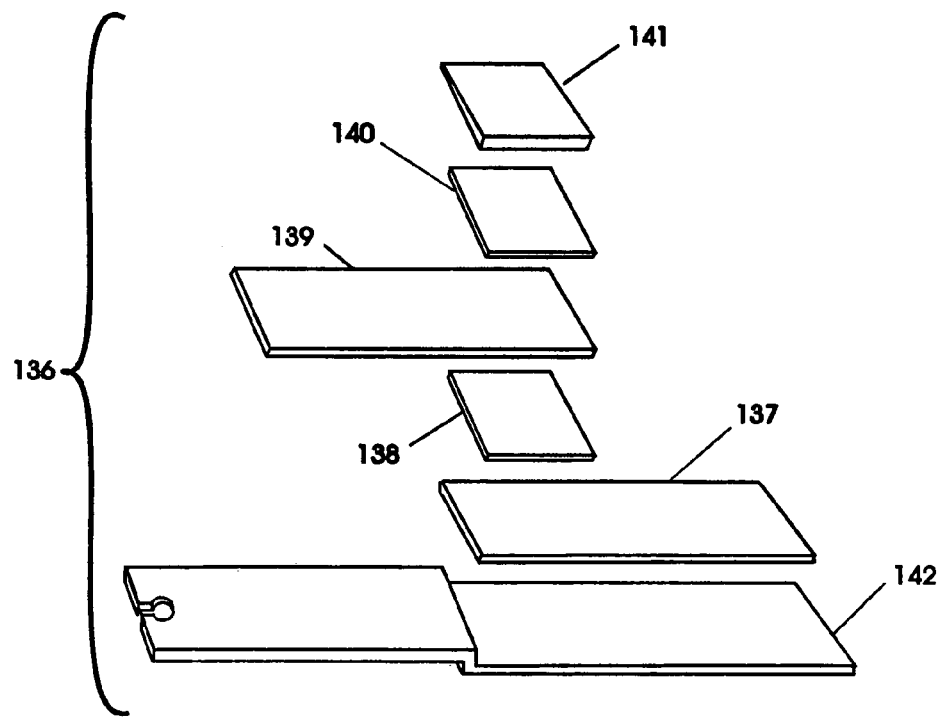
FIG. 17 illustrates an exploded view of a conductive wedge, p-type crystalline wafer, a hot fin, an n-type crystalline wafer, a cold fin, that comprise a coupon.

FIG. 17 exploded view 136 illustrates a cold fin 137, and an n-type crystalline wafer 138, a hot fin 139, a p-type crystalline wafer 140 along with a conductive wedge 141 that comprises parts of a coupon of this invention along with substrate support piece 142. An alignment substrate 142 is shown beneath the exploded view of the elements of the coupon and the relative position each element will occupy when assembled as a complete coupon. N-type wafer 138 is soldered to cold fin 137 and on the other side to hot fin 139. P-type wafer 140 is soldered to hot fin 139 on one side and to a conductive wedge 141 on the other side. In a preferred embodiment solder paste bonding is 95-5 tin-silver alloy solder having 4% additional pure silver powder added, applied in the region of contact between the semiconductor wafer 138, 140 and the hot fin, cold fin and wedge. It should be understood that reversing relative positions of wafer 138 and wafer 140 creates an electronically equivalent device with opposite electrical polarity.

Figure 18:
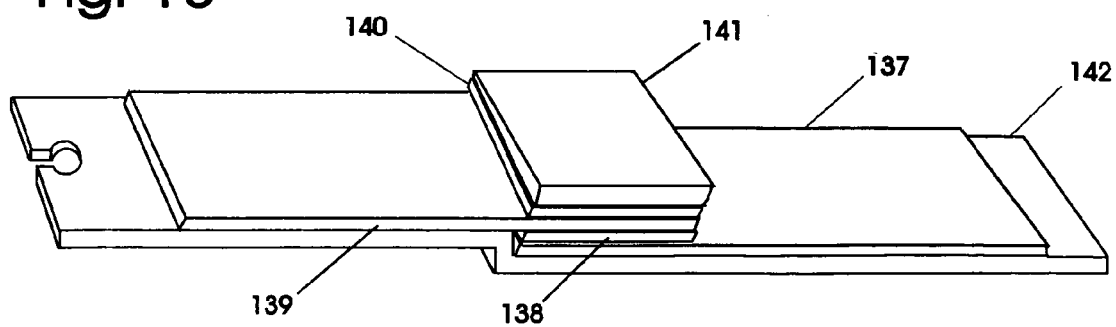
FIG. 18 illustrates the final positions of the elements of the coupon with all elements situated on an indexing substrate carrier.

FIG. 18 illustrates a cold fin 137, a hot fin 139, a p-type crystalline wafer 140 and an n-type crystalline wafer 138 and conductive wedge 141 that comprise a coupon 136 of this invention shown along with alignment substrate 142.

Figure 19:
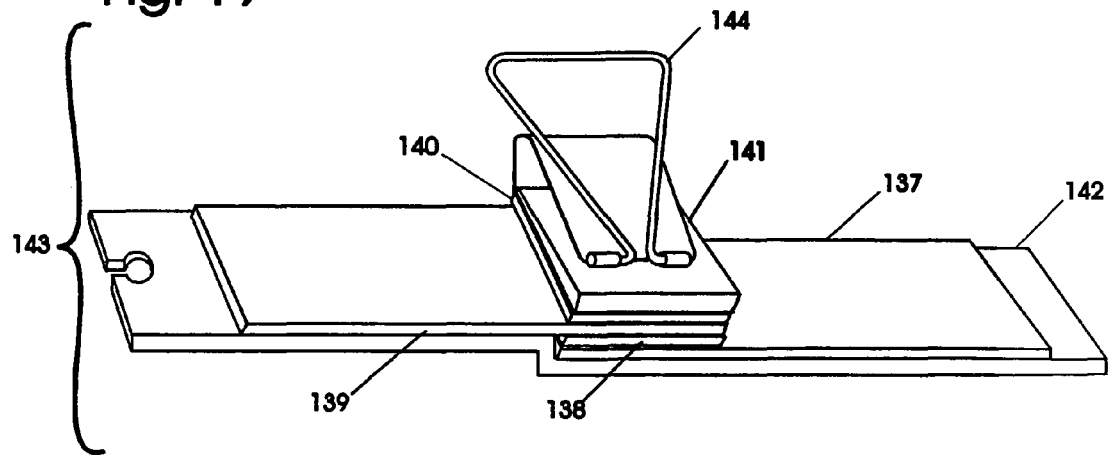
FIG. 19 illustrates an assembled coupon situated on an indexing substrate, parts held in alignment with a clamp.

FIG. 19 illustrates a final arrangement of the elements of the coupons 143 mounted on alignment substrate 142. FIG. 19 uses clamp 144 to maintain the element positions included in 143. In a preferred embodiment sixty of these coupons complete a 5-kW, 9-inch diameter thermoelectric ring. This number can be varied depending on the operating voltage desired. A 333-kW generator uses 142 coupons to compose a 24-inch diameter ring. The Seebeck voltage also effects how much voltage is produced for a given temperature differential between the hot and cold fins. It should be understood that the cold fins need not be directed at 180 degrees to the hot fins. Furthermore it is possible to fashion the shape of either the hot fin or the cold fin or both to preclude the need for the conductive wedge component. In a preferred embodiment tin-silver solder paste containing an additional 4% silver is applied to each side of each coupon except where the coupon is adjacent to an insulator component of the ring.

Figure 20:
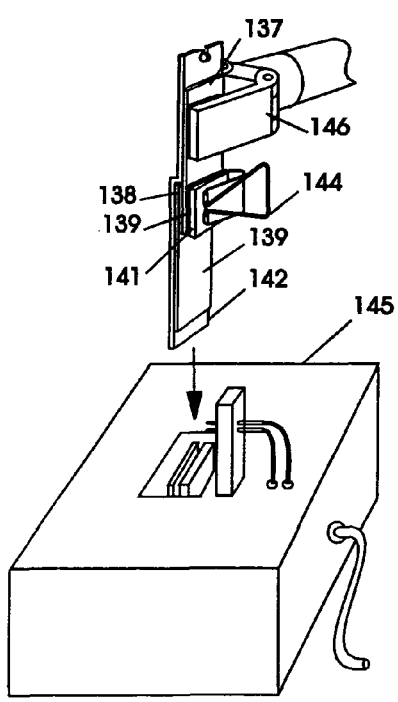
FIG. 20 illustrates how a robot picks up a coupon and inserts it into a test fixture for on-line testing.

FIG. 20 illustrates the robotic method of the coupon making machine placing an assembled and green solder pasted coupon 143 and substrate into an on-line test fixture 145. Green solder paste means solder paste applied to parts but not yet thermally melted or in the case of one-part epoxy cured and un-cured. Placing the coupon into the tester activates a computer-aided tester such as LABview manufactured by National Instruments of Austin, Tex., not shown. Current and voltage probes of 145 connect to test the coupon under real operating conditions. The computer-controlled tester determines whether the coupon under test passes or fails. In FIG. 20, the cold fin 137, the n-type wafer 138, the hot fin 139, the p-type wafer 140, and the conductive wedge 141 can be seen in their assembled position on substrate 142, held by clamp 144 being positioned to insert into test fixture 145 by robot jaws 146.

Figure 21:
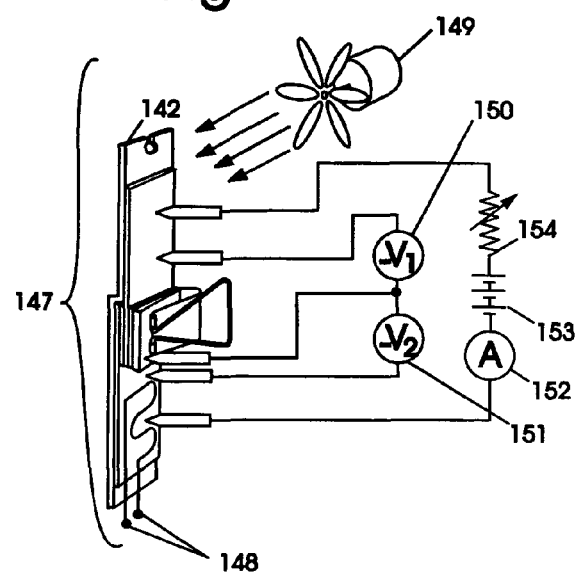
FIG. 21 illustrates an on-line test fixture and dynamic test method for determining un-bonded coupon performance both before and after thermal bonding.

FIG. 21 illustrates the electrical components 147 of test fixture 145 in FIG. 20. Heating element 148 is used to heat one end of the coupon 143, while blower 149 is used to cool the other end of coupon 143. The test program involves heating one end of the coupon while cooling the other with blower 149. Meters 150 and 151 are negative voltage meters that first detect $-V_1$ at zero-current voltage across the n-type wafer and the p-type wafers at a temperature that is caused by heater 148 and blower 149. While the temperature differential across wafer changes very slowly with time caused by heater 148, computer controlled test measurements occur very fast, much faster than temperature changes can occur. This allows accurate measurements of $-V_1$ and $-V_2$ made at 150 and 151 first at zero current and then with forced current, through coupon 143. The direction of forced current, measured at 152 is in the same direction that is caused by normal thermal heat flow through the ring. The faster the $-V_1$ and $-V_2$ measurements can be made with and without forced current, the less effect a changing temperature differential causes and affect the measured results. The current in test fixture 147 is sourced by battery 153. Current through coupon is regulated by variable load resistor 154. Reliable resistance measurements can be made on coupons clamped with green solder paste, as well as with coupons after heat bonding. The test method of 147 was described earlier in this patent. The test method allows on-line testing of components through all stages of manufacture, providing reliable pass or fail data that can be acted upon during processing. This prevents incorrectly assembled coupons with inferior electrical performance from entering the building cycle.

FIG. 22 illustrates a pressure operated solder paste dispenser 155 used with a robot to coat one side of a wafer 138, fin or wedge during robotic coupon assembly. Air pressure to the dispenser 155 is pulsed when the robot arm nears the dispenser 155, causing a measured amount of solder paste 156 to appear on paste applicator 157. Lid flange and cap 158, dip tube 159 and paste flask 160 are installed in the tabletop, mounted over dowels to secure the applicator device 155 to a location where the robot can be programmed to accurately home.

FIG. 23 describes a combination tool 161 that consists of a vacuum pickup chuck 162, mounted to robot jaws 146. Vacuum supply line 163 draws and holds articles to pickup chuck 162 for precise holding while the robot arm positions the part in the proper place as programmed. The vacuum supply 164 is controlled by the robot's program to operate with arm movement, turning on-off vacuum synchronized with arm movement for programmed parts pickup, placement and processing.

FIG. 24 illustrates a marking fixture 165, composed of marking pens 166 that allows robot jaws 146 to mark coupon 143 with mark 167 using various colored pens held in holding fixture 168. Depending on computer controlled electrical test results, the robot is programmed to place the coupon in contact with one of the colored paint pens that indicated the results of the on-line testing. The robot is then programmed to place the coupon 143 in a fail bin, or to place it on the conveyor furnace belt for thermal bonding.

FIG. 25 is top view of a coupon making machine 169 composed of a one-armed robot 170 and various parts placement and test aids. Robot 170 is mounted on a special tabletop 171 with various fixtures positioned and attached firmly to the tabletop. Marking fixture 165 is located near fail bin 172, which is located near computer controlled electronic tester 145. Central to the robot's radius of movement is a dock fixture 173 where the parts making up a coupon 143 are assembled and aligned. Located within the robot's radius of movement and aligned to the working radius are parts delivery chutes 174 that deliver the various elements making up a coupon 143. Elements making up a coupon are individually picked up by vacuum chuck 162 attached to robot jaws 146. Paste dispenser 155 is located on tabletop 171 along the robot's operating radius to allow solder paste application as required. Coupon assembly involves the vacuum pickup of the alignment substrate 142 with robot 170 and placement of substrate 142 into dock fixture 173. After substrate 142 is placed in the dock, robot arm 175 then moves to vacuum pickup a cold fin 137 placing this on top of the substrate 142 already located in the dock 173. The robot arm 175 then lifts and swings to vacuum pick up an n-type wafer 138, moving the wafer over and lightly touching the solder paste dispenser 155. With wafer held in place over paste dispenser 155, a short pulse of air pressure delivers paste to one side of the n-type wafer 138. The robot-arm 175 then lifts and swings the n-type wafer over the dock position and places the wafer 138 with solder past onto cold fin 137. Then robot arm 175 lifts and moves vacuum chuck 162 to a position over the chute that delivers hot fin 139. The robot arm 175 then picks up the hot fin using vacuum chuck 162 and locates the hot fin over the paste dispenser 155 where fin 139 is one-side coated with solder paste using dispenser 155. Robot arm 175 then lifts hot fin 139 with green solder past applied and swings to dock 173 position lowering hot fin 139 to place in contact with n-type 138 wafer and substrate 142. Releasing vacuum, robot arm 175 lifts and swings over p-type wafer 140. P-type wafer 140 is picked up by robot arm 175 using vacuum and delivered over paste dispensing station 155, lowered, paste coated and delivered into dock 173, placed onto hot fin 139. Robotic arm 175 then moves to vacuum pickup wedge 141, moving 141 to solder paste dispenser 155 position, where 141 is green solder coated, moved and the one-side coated wedge 141 is placed onto the p-type wafer 140 positioned at the dock 173. Robot arm 175 then lifts and moves to dispensing chute containing clamps 144, grasps and squeezes clamp 144 from the delivery chute 174, then moves the clamp near the dock position. Robot arm 175 squeezes clamp 144 and moves to cover the assembled parts of coupon 143 with clamp 144 and then releases squeeze pressure applied to clamp 144. Without moving robot arm 175 away from dock 173, jaws 146 again grasp clamp 144 so as to hold the coupon 143 without releasing clamping pressure on coupon 143. The robot arm then delivers the assembled coupon over computer controlled test fixture 145 and arm 175 rotates to insert the clamped coupon 143 assembly into test fixture 145 to begin an electrical test under computer control, not shown. Depending on the results of electrical test of coupon 143, the programmable robot is instructed to move to marking station 165 where coupon 143 is marked with one of three colors depending on test results. A red mark indicates fail and the robot moves to place failed coupon in fail bin 172. A blue mark indicates pass and the coupon is moved by robot to the furnace conveyor belt 176 placed for thermal bonding on in-going conveyor belt.

Figure 26:
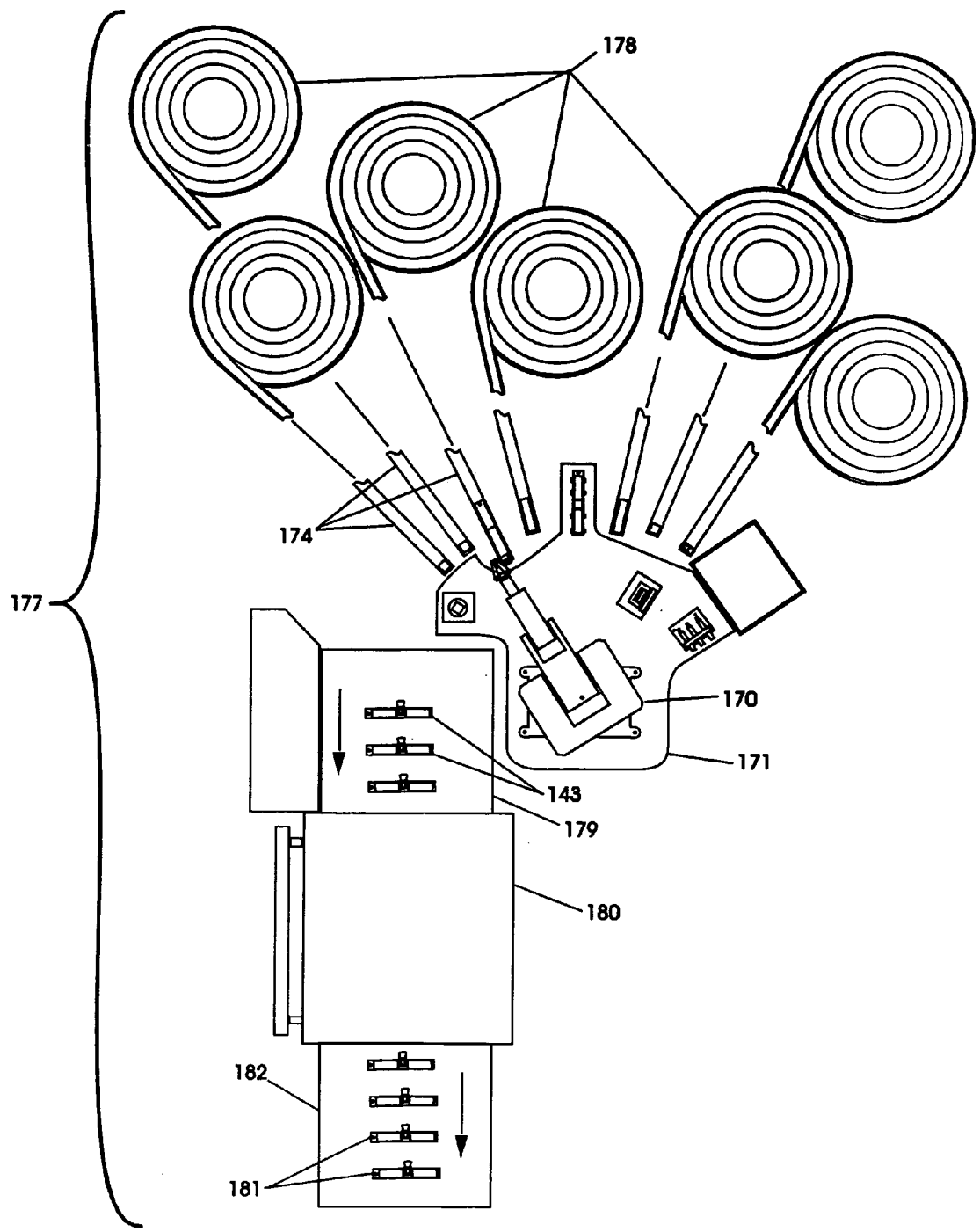
FIG. 26 illustrates the top view of the coupon-making machine with part handlers, delivery chutes, robot and conveyor bonding furnace.

FIG. 26 is an expanded top view 177 of FIG. 25, showing the relationship of vibration parts feeders 178 and in-going conveyor belt 179 and thermal bonding furnace 180. Vibration parts feeders 176, also called "Centron bowls", are used to separate, orient, and deliver individual parts used in machine automation. Individual bowls can hold and process enough parts to operate for 24-hours, to place parts into individual parts delivery feed chutes 174 that are used in the make-up of thermoelectric coupons 143 by coupon assembly machine 169. Tested green coupons 143 are placed on the in-going conveyor belt 179 of thermal bonding furnace 180 with oxygen-free atmosphere. Heat bonded coupons 181 exit furnace 180 on out-going conveyor belt 182. A controller supervises the thermal profile and conveyor belt speed of atmosphere furnace 180.

Figure 27:
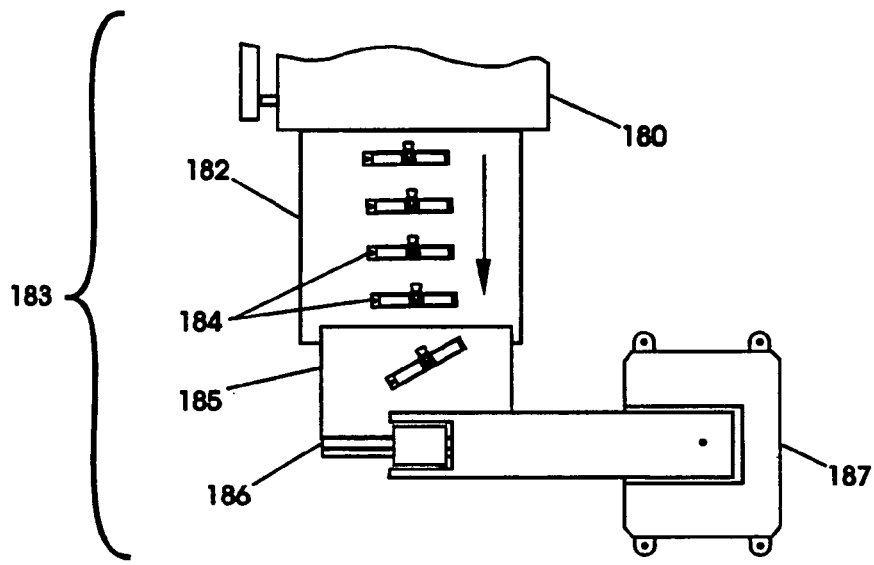
FIG. 27 illustrates a means of removing coupons from bonding furnace oriented for further processing by a second robot.

FIG. 27 is a top view 183 of the backend of atmospheric furnace 180 showing bonded coupons 184 exiting on out-going conveyor belt 182 sliding one at a time down slide 185 and catch chute 186 where bonded coupons can be picked up by robot 187.

Figure 28:
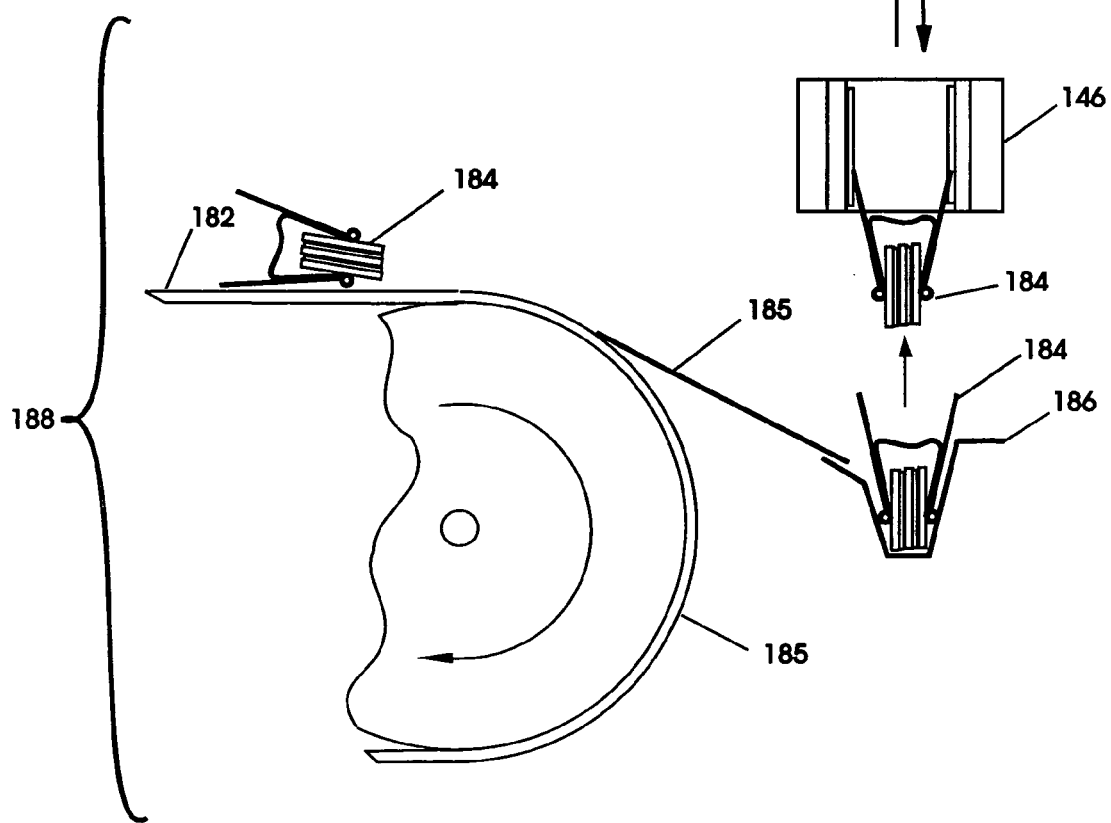
FIG. 28 illustrates a side view of coupons coming off furnace belt to orient into an orienting chute.

FIG. 28 is a side view 188 of the backend of out-going furnace conveyor belt 182 of atmospheric furnace 180 showing slide 185 and catch chute 186 with bonded, clamped coupon 184 in catch placement position. This arrangement makes it possible for robot 187 jaws to capture and lift coupon 184 for further processing.

Figure 29:
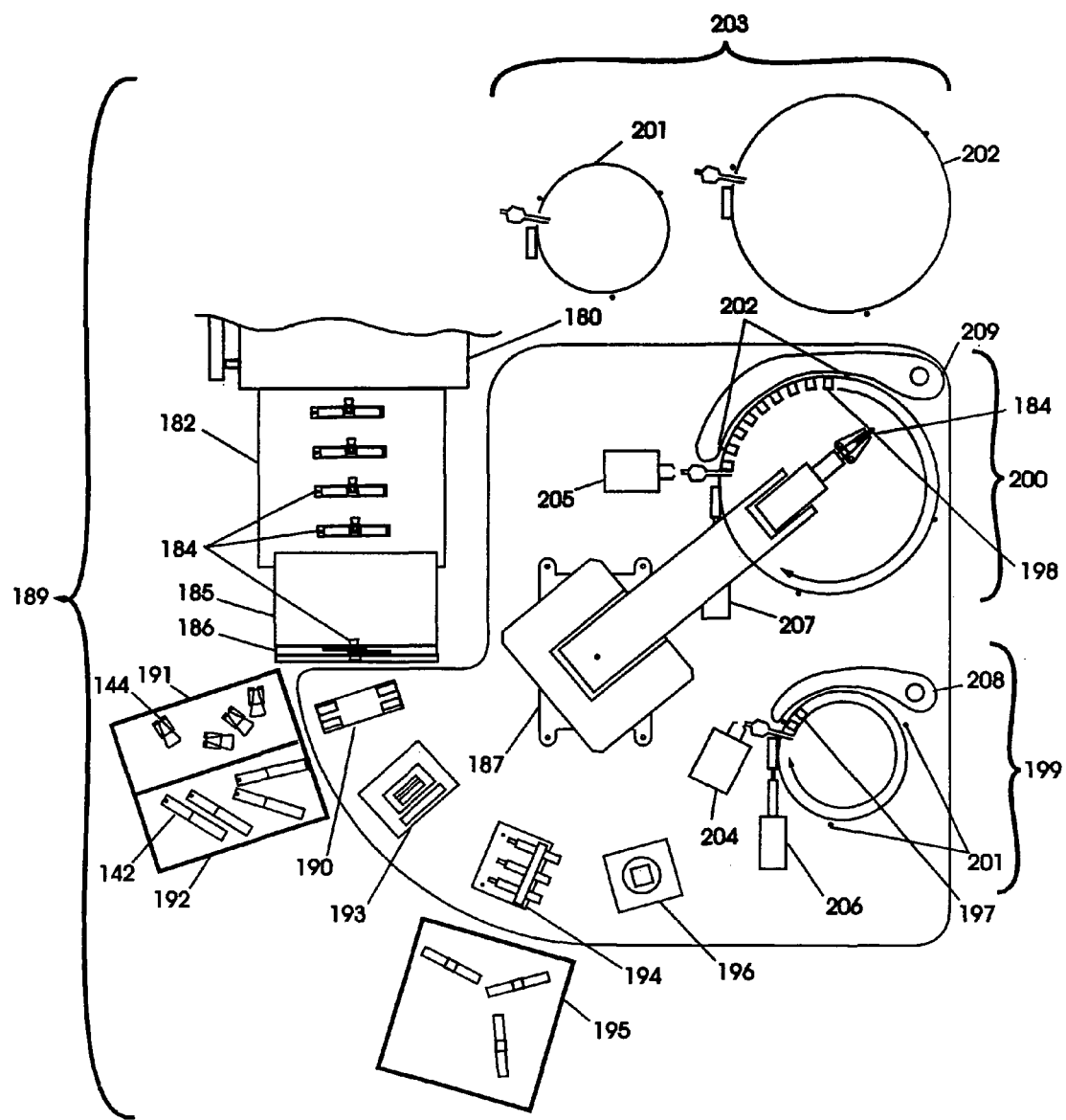
FIG. 29 illustrates a top view of a second robotic work station that assembles thermoelectric rings.

FIG. 29 shows a top view of thermoelectric ring making machine 189. Bonded coupons 184 exit out-going conveyor belt 182 of furnace 180. Coupons slide down chute 185, and become positioned for robotic pickup 187. Chute 186 will incorporate a parts buffer not shown to store extra coupons 184 during times when robot 187 is busy with ring making activities. Assembly robot 187 grips coupon 184 individually to place in clamp-and-substrate-off dock 190. Robot 187 removes clamp 144 from coupon 184 and places clamp in bin 191, substrate 142 in bin 192. Robot 187 then grips bonded coupon 184, rotates to insert into computer controlled test station 193. Depending on computer controlled test results at 193, robot 187 marks coupon 184 at mark station 194 with red or blue paint mark. Robot 187 then places red-marked failed coupons in fail bin 195 and either picks up another coupon for clamp-and-substrate removal from chute 186, or moves a blue marked coupon 184 to solder paste dispenser station 196 for solder paste application. Once solder paste is applied to blue mark passed, tested coupon 184, robot 187 rotates blue-marked coupon into vertical position and places coupon 184 within up-converter-strap assembly 197 for 9-inch rings and 198 for 24-inch rings located at ring assembly stations 199 and 200. Up-converter-strap assemblies, 201, 202 are positioned by robot 187 at ring assembly stations 199, 200 to begin ring assembly. Up-converter-strap assemblies 201, 202 are acquired from material supply bin 203 where up-converter-straps are stored until needed to begin the build cycle for a new ring. Up-converter-strap assemblies are manufactured with legs to stand in proper position to receive green-pasted coupons 184 that are used to form a ring. Testers 204 and 205 are computer controlled that perform electrical tests on completed rings after straps 201, 202 are tightened by strap-tightening motors 206, 207. Swing arms 208, 209 move the completed, tested rings onto conveyor belt furnace, not shown, for thermal bonding or pushed further onto a fail ring bin ramp depending on test results of computer controlled testers 204, 205. Robot 187 uses swing arms 208, 209 to effect completed ring positioning.

Figure 30:
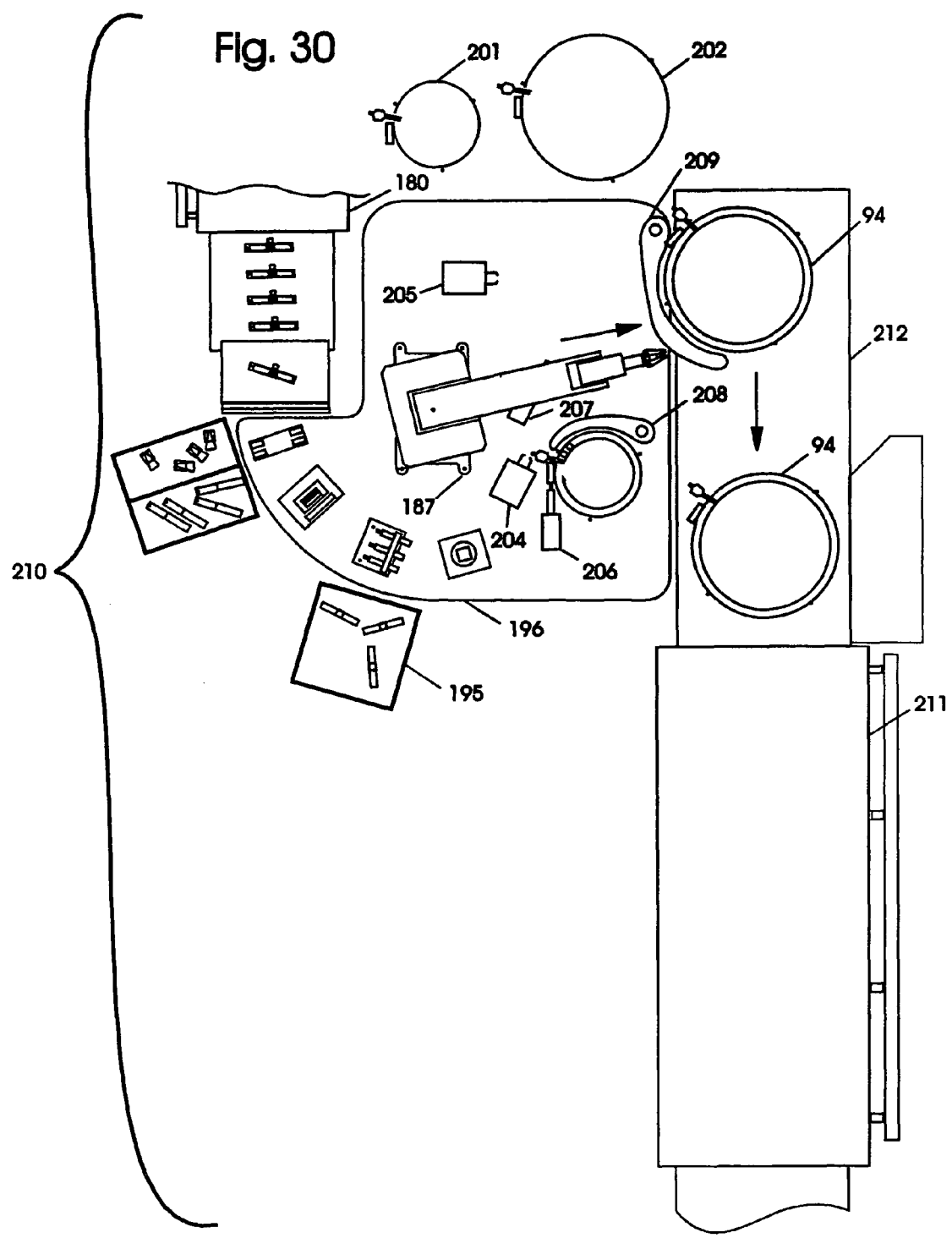
FIG. 30 illustrates a top view of a second robotic work station that assembles and tests thermoelectric rings and places them on a belt furnace for bonding.

FIG. 30 is an extended top view of FIG. 29 ring making machine showing connection to ring-bonding atmospheric furnace in 211. Robot 187 is shown using swing arm 209, of set 208, 209 to position completed ring 94 onto in-going conveyor belt 212 of oxygen-free atmospheric furnace 211. Finished, tested, thermoelectric rings 94 move through oxygen-free conveyor furnace 211.

Figure 31:
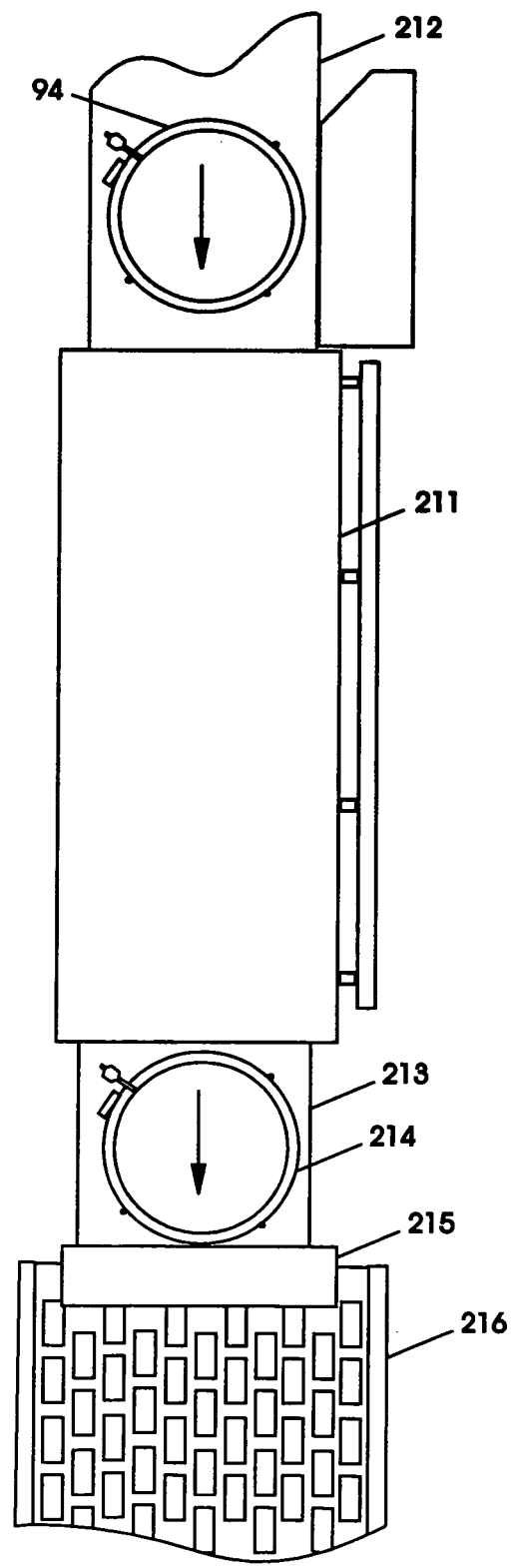
FIG. 31 shows a ring entering and exiting a conveyor furnace that presents bonded product for further generator and chiller assembly.

FIG. 31 is an extension of top view FIG. 30 showing out-going conveyor belt 213 discharging finished bonded thermoelectric ring 214 onto slide chute 215 to roll slowly down roller ramp conveyor 216 for further processing.

In a preferred embodiment finished bonded thermoelectric rings would be cued to undergo further automatic processing. For instance, a secondary coil with printed circuit controller board interconnecting to up-converter, connected to computer controlled tester will be inserted between up-converter straps on ring 94 in FIG. 9. The switch-bank will be solder pasted and inserted between the up-converter strap 201, 202 and a functional green-test will be made of the complete thermoelectric system with switch-bank installed. Upon pass of this test, the heater-equipped jaws forcing up-converter strap 201, 202 into switch-bank, not shown, will be activated to make connections complete. A final functional electrical test will follow. This completes the ring making process and passed thermoelectric systems will move by conveyor to final assembly and test.

In a preferred embodiment the finished and passed thermoelectric systems will be placed by robot into die-drawn stainless case, on top of a bead of silicon, high temperature RTV dispensed by the robot. The connecting controller board will be positioned and snapped into place by the same robot. Top cover is computer placed, held in place by a bead of RTV. A motor-driven double fan with supports and hot-to-cold section baffle, is glued and installed by computer to complete the assembly. The assembly is loaded into a box for shipment, instruction and warranty papers included. Box is then sealed by the computer and computer placed on pallet for shipment.

Figure 32:
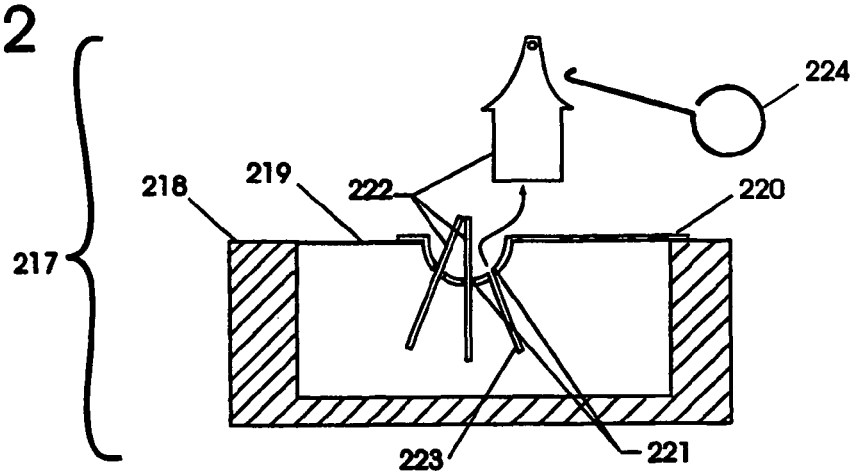
FIG. 32 illustrates a system for creating a casting mold for net-shaped thermoelectric wafers.

FIG. 32 illustrates a system 217 for creating a casting mold 218 for net-shaped thermoelectric wafers. Wafer manufacture of thermoelectric devices is a time consuming and labor intensive part of thermoelectric manufacturing process. Shaping damage-free wafers is problematic and shrinkage due to breakage is a major cost adder in wafer production. The system of 217 consists of a box 218 filled with pressed hollow ceramic beads 219 with a trace quantity of low-dropping-point high temperature grease to hold shape. Slotted impression mold pattern 220 with slots 221 allow pattern 222 to be pressed into the hollow ceramic beads 219 forming wafer-shaped cavities 223 in beads 219 along runner indentation in the otherwise flat surface of pressed beads. The wafer cavities are connected by trunk runner, which later receives molten thermoelectric metal. Re-usable polycarbonate parts 222 are shown in system 217 some shown pressed through slots 221 in pattern and one 222 carefully removed from mold pattern 220 by wire hook 224 leaving a cavity 223 under pattern 220 in pressed beads 219. After all parts 222 are inserted through slots 221 and carefully removed to reveal mold cavity 223, the pattern 220 is removed to yield a ready to pour net shape mold for casting thermoelectric material as net-shaped wafers. Wafer cavities 223 are connected in pressed bead impression connecting pattern 220 as a ready to pour casting mold.

Figure 33:
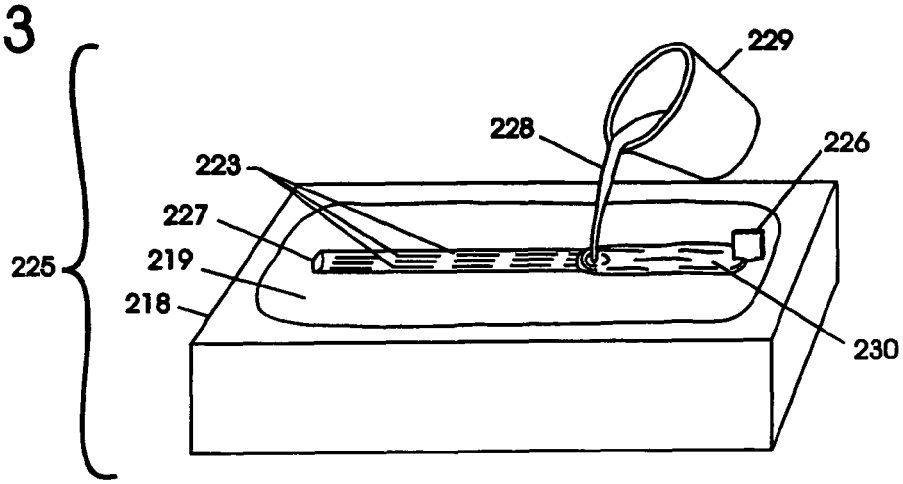
FIG. 33 illustrates a system for pouring a tree of thermoelectric wafers causing each net-shaped crystal to grow single crystal as molten metal slowly cools to solidify and then reduced to near room temperature.

FIG. 33 illustrates a system 225 for pouring a tree of thermoelectric wafers causing each net-shaped crystal to grow single crystal as molten metal slowly cools to solidify and then continuing to grow single as temperature reduces to near room temperature. Mold system 225 illustrates the casting method for thermoelectric material resulting in a low cost, net-shaped, high yield method for producing single crystal thermoelectric wafers. To create single crystal net shaped wafers as poured, a single crystal seed 226 is inserted into the pressed bead mold with half of the seed protruding into cavity 227 that will become the runner 230 when poured. Formulated thermoelectric material 228 is melted in crucible 229 and poured into the pressed bead imprint beginning at the seed crystal 226 end of the mold 218. Molten thermoelectric material 228 poured from the seed end of the mold with crucible 229 fills runner cavity 227. Thermoelectric material 228 in runner 230 micro-melts into seed crystal 226 while flowing into cavities 223 formed by the removal of the replicate polycarbonate wafers 222. As molten runner 230 cools to a solid beginning at the seed crystal 226 end of runner imprint, runner material 230 solidification proceeding away from the seed 226, into filled wafer cavities 223 to become single crystal net-shaped wafers with the same orientation as seed crystal 226. As the material in wafer cavities 223 slowly cool, they too become single crystal, with minimum number of grain boundaries and traps for high flux electronic carriers. Experience shows that a 5-minute cool down undisturbed in mold fixture 218 is required to complete the single crystal wafer growth process.

Figure 34:
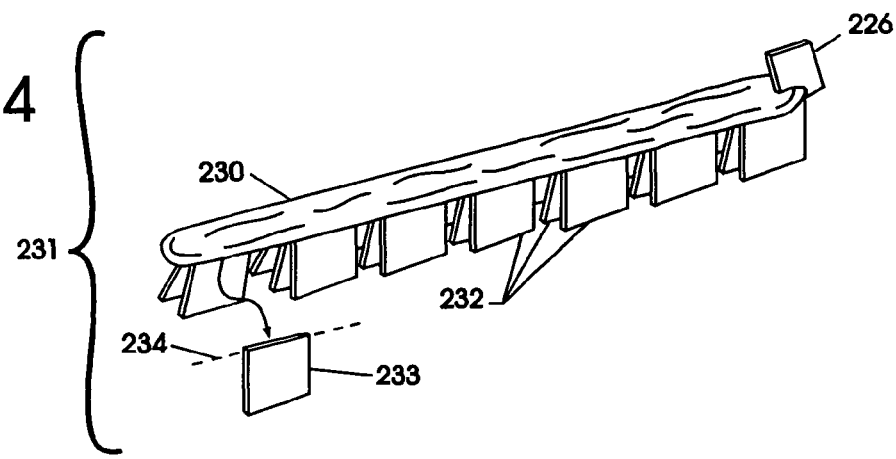
FIG. 34 illustrates a tree of net shaped thermoelectric wafers removed from mold as single crystal caused by a seed crystal mounted in the mold runner.

FIG. 34 illustrates a system 231 for tree growth of net shaped thermoelectric wafers for mold growing single crystals 232 from a seed crystal 226 in the mold runner 230. System 231 shows a single crystal tree of wafers removed from mold system 225 with connecting net shaped wafers 232 of solidified thermoelectric material 230 connecting runner allows material to grow single from seed crystal to individual wafers 232 through runner 230. Wafer 233 is shown separated from runner tree 230 by scribing along a line 234 with carbide tipped pencil on wafer material then carefully snapping wafer 233 from runner tree 230. Another method of parting wafer 233 from tree 230 is by partly scoring along parting line 234 with a small rotary grinding tool and snapping wafer 233 from runner tree 230. When care is taken to prevent the inadvertent mixing of p- and n-type materials when selecting seed materials for a type pour, the runner and seed after wafers are removed from the tree runner can be rough-crushed and used for subsequent pours to reduce material waste and cost of crystal wafer manufacture.

Figure 35A:
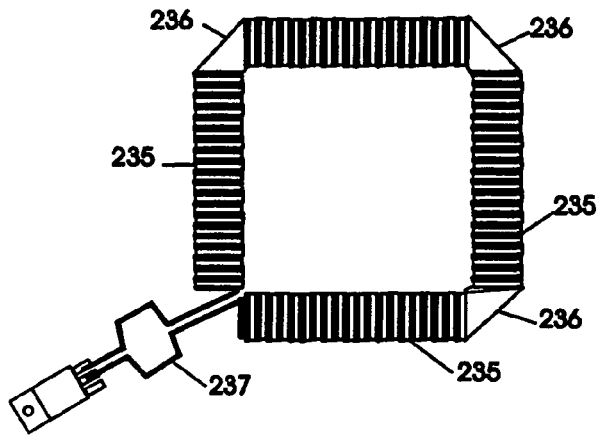
FIG. 35a shows a rectangular arrangement of linear coupons for a thermoelectric device.

FIG. 35a illustrates a rectangular arrangement of linear arranged coupons 235 without individual wedges between coupons using instead three 90 degree wedges 236 located at ends of coupon sets 235 and one corner of the rectangle arrangement of coupons terminating with up-converter 237 closing the circuit for current flow in the thermoelectric device.

Figure 35B:
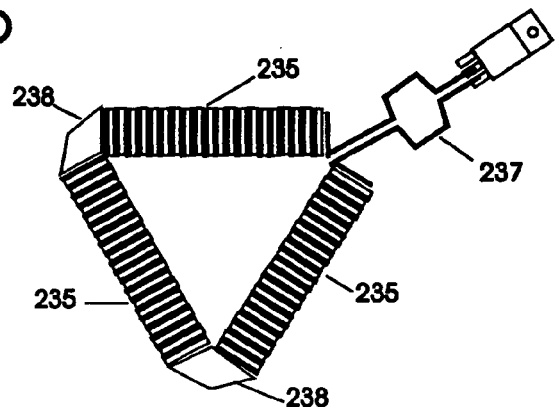
FIG. 35b illustrates a triangular arrangement of linear coupons for a thermoelectric device.

FIG. 35b illustrates a triangular arrangement of linear arranged coupons 235 with special wedge 238 in two places and an up-converter 237 closing the circuit for current flow in the thermoelectric device.

Figure 35C:
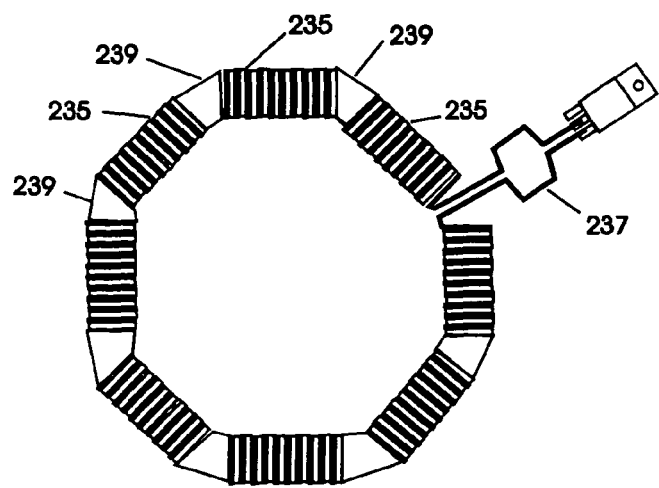
FIG. 35c shows an octagonal arrangement of linear coupons for a thermoelectric device.

FIG. 35c illustrates an octagonal arrangement of linear arranged coupons 235 with special wedge 239 in seven places and an up-converter 237 closing the circuit for current flow in a thermoelectric device. Thermoelectric rings or loops can be configured to work with any number of geometric shapes, even stacked as a coiled helix with ends terminated with an up-converter 237 closing the circuit for current flow to output useful electrical energy or pump heat as a chiller.

Solder paste bonding can be replaced with silver epoxy formulated with high temperature one-part polyamide epoxy. Epoxy Technology, 14 Fortune Drive, Biterica, Mass. 01821, single component E3084 was evaluated. When high temperature silver epoxy is used for bonding of thermoelectric, no metal coating of nickel is necessary on the wafers contacting surfaces of coupons to achieve the same electrical performance as nickel and tin-silver solder bonding. Thermoelectric voltage evaluation results, expressed as α, measured as micro-volts/C for Sn/Ag solder paste and then silver epoxy coupons, is charted below:

| Hot-point probe | Clamped green | After bond | Green ring | Ring bonded |
|---|---|---|---|---|
| Sn/Ag paste 270 | 240 | 170 | 140 | 120 poor |
| Silver epoxy 275 | 280 | 270 | 275 | 280 excellent |

The forcing current test methodology works well for measuring contact resistance with both tin-silver solder paste, cured and un-cured and one-component high temperature silver epoxy from Epoxy Technology. The above chart shows how thermoelectric voltage holds up during process for tin-silver solder paste and silver epoxy.

Also, just like silicon electronic devices, thermoelectric semiconductor wafers require edge passivation for long-lifetime operation, high reliability. An edge coating of high temperature curing varnish with dye coloring is used, red for p-type and blue for n-type. A suitable dye for the edge-coating varnish is Rit dye used sparingly from Phoenix Brands, Indianapolis, Ind. Wafers are edge-only coated and cured at 150 C prior to assembly into coupons. Edge coated wafers with polyester have 200 microvolt per degree C. α and higher operating voltages after varnish cure. Delphon CC-1105, one-part polyester pre-catalyzed, from John C. Dolph Company, Monmouth Junction, N.J. is used for edge junction coating. Unlike nickel coated wafers that tend to degrade to as low as 20 micro-volts per degree centigrade during coating, coupon bonding and ring formation using one-part silver epoxy for wafer bonding has significantly higher voltage and higher operating temperatures than the nickel-plated, tin-silver solder bonding process. This high voltage operating performance continues through the coupon and ring forming process, to final operating tests and on into long term generation and chiller operation in the field as demonstrated in the above chart.

Thus having described the method of fabricating the test instrument, a means of measuring thermoelectric material, and a variety of examples as to how said measuring instrument may be used in a broad range of thermoelectric components, and having described a manual means for manufacturing generator rings as well as an automatic means for manufacturing generator rings, we claim:

We claim:
1. A quality control procedure for evaluating performance of a thermoelectric component that includes least one thermoelectric coupon that has at least a series connected pair of selenium doped bismuth telluride and bismuth doped antimony telluride wafers included therein, said thermoelectric coupon being adapted for inclusion in a thermoelectric generator, the quality control procedure comprising steps of:
(A) attaching a volt meter to said thermoelectric component via a probe;
(B) connecting an amp meter in series with said thermoelectric component;
(C) without any external electrical current applied to the thermoelectric component, using the volt meter to measure a first voltage produced by said thermoelectric component;
(D) while applying a known forced electrical current externally through said thermoelectric component in a direction current would flow if the thermoelectric component were short circuited, using the amp meter to measure the forced current, and using the volt meter to measure a second voltage of said thermoelectric component; and
(E) calculating electrical resistance for said thermoelectric component using:

i. the first voltage measured in step (C) above while no external current flows through said thermoelectric component;

ii. the second voltage measured in step (D) while the forced current flows through said thermoelectric component; and ii. the known, externally applied forced current flowing through the thermoelectric component measured in step (D) using the amp meter.

2. The quality control procedure of claim 1 wherein the performance evaluation is performed on an un-bonded thermoelectric coupon.

3. The quality control procedure of claim 1 wherein the performance evaluation is performed on a bonded thermoelectric coupon.

4. The quality control procedure of claim 1 wherein the performance evaluation is performed on an un-bonded ring of thermoelectric coupons.

5. The quality control procedure of claim 1 wherein the performance evaluation is performed on a bonded ring of thermoelectric coupons.

6. The quality control procedure of claim 1 wherein the performance evaluation is accomplished using an automated measurement system.

7. The quality control procedure of claim 1 comprising the further step of heating one side of said thermoelectric component while another side thereof remains cool while measuring the first voltage and the second voltage.

8. The quality control procedure of claim 1 comprising the further step of:

(F) estimating electrical power output producible by said thermoelectric component using:
i. the first voltage measured for said thermoelectric component in step (C); and
ii. the electrical resistance of said thermoelectric component calculated in step (E).

9. The quality control procedure of claim 7 wherein the performance evaluation is performed on an un-bonded thermoelectric coupon.

10. The quality control procedure of claim 7 wherein the performance evaluation is performed on a bonded thermoelectric coupon.

11. The quality control procedure of claim 7 wherein the performance evaluation is performed on an un-bonded ring of thermoelectric coupons.

12. The quality control procedure of claim 7 wherein the performance evaluation is performed on a bonded ring of thermoelectric coupons.

13. The quality control procedure of claim 7 wherein the performance evaluation is accomplished using an automated measurement system.

14. The quality control procedure of claim 7 comprising the further step of:

(F) estimating electrical power output producible by said thermoelectric component using:
i. the first voltage measured for said thermoelectric component in step (C); and
ii. the electrical resistance of said thermoelectric component calculated in step (E).

* * * * *